(12) United States Patent
Harada et al.

(10) Patent No.: US 11,556,771 B2
(45) Date of Patent: Jan. 17, 2023

(54) SEMICONDUCTOR NEURAL NETWORK DEVICE INCLUDING A SYNAPSE CIRCUIT COMPRISING MEMORY CELLS AND AN ACTIVATION FUNCTION CIRCUIT

(71) Applicant: SEMICONDUCTOR ENERGY LABORATORY CO., LTD., Atsugi (JP)

(72) Inventors: Shintaro Harada, Shizuoka (JP); Hiroki Inoue, Kanagawa (JP); Takeshi Aoki, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 629 days.

(21) Appl. No.: 16/603,710

(22) PCT Filed: Apr. 2, 2018

(86) PCT No.: PCT/IB2018/052249
§ 371 (c)(1),
(2) Date: Oct. 8, 2019

(87) PCT Pub. No.: WO2018/189619
PCT Pub. Date: Oct. 18, 2018

(65) Prior Publication Data
US 2020/0110990 A1    Apr. 9, 2020

(30) Foreign Application Priority Data
Apr. 10, 2017  (JP) .............................. JP2017-077451
Jun. 1, 2017   (JP) .............................. JP2017-109232

(51) Int. Cl.
*G11C 11/40*        (2006.01)
*G11C 11/54*        (2006.01)
(Continued)

(52) U.S. Cl.
CPC ......... *G06N 3/0635* (2013.01); *G11C 7/1006* (2013.01); *G11C 11/40* (2013.01); *G11C 11/54* (2013.01)

(58) Field of Classification Search
None
See application file for complete search history.

(56) References Cited

U.S. PATENT DOCUMENTS 5,444,822 A *  8/1995  Shinohara .............. G06N 3/063
                                                    706/41
6,057,885 A    5/2000  Horishi et al.
(Continued)

FOREIGN PATENT DOCUMENTS

CN    107077734 A    8/2017
EP    3255606 A     12/2017
(Continued)

OTHER PUBLICATIONS

Pelayo et al. (1991) "Cmos implementation of synapse matrices with programmable analog weights" In: Prieto, A. (eds) Artificial Neural Networks. IWANN 1991. Lecture Notes in Computer Science, vol. 540. Springer, Berlin, Heidelberg, pp. 307-314. (Year: 1991).*

(Continued)

*Primary Examiner* — J. H. Hur
(74) *Attorney, Agent, or Firm* — Nixon Peabody LLP; Jeffrey L. Costellia

(57) ABSTRACT

Novel connection between neurons of a neural network is provided.
A perceptron included in the neural network includes a plurality of neurons; the neuron includes a synapse circuit and an activation function circuit; and the synapse circuit includes a plurality of memory cells. A bit line selected by address information for selecting a memory cell is shared by a plurality of perceptrons. The memory cell is supplied with (Continued)

a weight coefficient of an analog signal, and the synapse circuit is supplied with an input signal. The memory cell multiplies the input signal by the weight coefficient and converts the multiplied result into a first current. The synapse circuit generates a second current by adding a plurality of first currents and converts the second current into a first potential. The activation function circuit is a semiconductor device that converts the first potential into a second potential by a ramp function and supplies the second potential as an input signal of the synapse circuit included in the perceptron in a next stage.

12 Claims, 22 Drawing Sheets

(51) Int. Cl.
*G11C 7/10* (2006.01)
*G06N 3/063* (2006.01)

(56) References Cited

U.S. PATENT DOCUMENTS

| | | | |
|---|---|---|---|
| 6,452,237 | B1 | 9/2002 | Varshavsky |
| 6,470,328 | B1 | 10/2002 | Varshavsky |
| 9,851,942 | B2 | 12/2017 | Kurokawa |
| 10,141,069 | B2 | 11/2018 | Ikeda et al. |
| 2012/0033488 | A1 | 2/2012 | Nagatsuka et al. |
| 2016/0172410 | A1 | 6/2016 | Kurokawa |
| 2016/0343452 | A1 | 11/2016 | Ikeda et al. |
| 2017/0063351 | A1 | 3/2017 | Kurokawa |
| 2017/0116512 | A1 | 4/2017 | Kurokawa |
| 2017/0118479 | A1 | 4/2017 | Kurokawa |
| 2017/0220891 | A1 | 8/2017 | Kim et al. |
| 2017/0263291 | A1 | 9/2017 | Kurokawa |
| 2017/0270405 | A1 | 9/2017 | Kurokawa |
| 2017/0317085 | A1 | 11/2017 | Kurokawa |
| 2019/0164620 | A1 | 5/2019 | Ikeda et al. |

FOREIGN PATENT DOCUMENTS

| | | |
|---|---|---|
| JP | 09-319730 A | 12/1997 |
| JP | 2016-146174 A | 8/2016 |
| JP | 2016-219011 A | 12/2016 |
| JP | 2017-130195 A | 7/2017 |
| WO | WO-2016/125476 | 8/2016 |

OTHER PUBLICATIONS

Prieto, A. et al. (1990). Simulation and hardware implementation of competitive learning neural networks. In: Garrido, L. (eds) Statistical Mechanics of Neural Networks. Lecture Notes in Physics, vol. 368. Springer, Berlin, Heidelberg, pp. 189-204. (Year: 1990 ).*
International Search Report (Application No. PCT/IB2018/052249) dated Jul. 24, 2018.
Written Opinion (Application No. PCT/IB2018/052249) dated Jul. 24, 2018.
Aslam-Siddiqi.A et al., "A 16 × 16 Nonvolatile Programmable Analog Vector-Matrix Multiplier", IEEE Journal of Solid-State Circuits, Oct. 1, 1998, vol. 33, No. 10, pp. 1502-1509.
Merrikh Bayat.F et al., "Redesigning Commercial Floating-Gate Memory for Analog Computing Applications", ISCAS 2015 (IEEE International Symposium on Circuits and Systems), May 1, 2015, pp. 1921-1924.

* cited by examiner

SEMICONDUCTOR NEURAL NETWORK DEVICE INCLUDING A SYNAPSE CIRCUIT COMPRISING MEMORY CELLS AND AN ACTIVATION FUNCTION CIRCUIT

TECHNICAL FIELD

One embodiment of the present invention relates to a semiconductor device, an electronic component, and an electronic device.

Note that one embodiment of the present invention is not limited to the above technical field. The technical field of one embodiment of the invention disclosed in this specification and the like relates to an object, a method, or a manufacturing method. In particular, one embodiment of the present invention relates to a semiconductor device, a display device, a light-emitting device, a power storage device, a memory device, a driving method thereof, or a manufacturing method thereof.

Note that in this specification and the like, a semiconductor device means an element, a circuit, a device, and the like that can function by utilizing semiconductor characteristics. As an example, a semiconductor element such as a transistor or a diode is a semiconductor device. As another example, a circuit including a semiconductor element is a semiconductor device. As another example, a device provided with a circuit including a semiconductor element is a semiconductor device.

BACKGROUND ART

Owing to development of information technology such as IoT (Internet of things) and AI (Artificial Intelligence), the amount of data to be processed tends to increase. A semiconductor device that can store a large amount of data is required in order that an electronic device utilizes information technology such as IoT and AI. Further, a semiconductor device that can perform processing at high speed is required for comfortable use of electronic devices.

Patent Document 1 discloses a configuration of a product-sum operation circuit in which the circuit scale is reduced depending on memory usage in a digital circuit that performs product-sum operation.

Patent Document 2 discloses a configuration in which multilevel data is retained by utilizing a difference in the threshold voltage of a transistor in a memory cell, which depends on the amount of charge accumulated in a node of the transistor.

REFERENCE

Patent Document

[Patent Document 1] Japanese Published Patent Application No. 1997-319730
[Patent Document 2] United States Patent Application Publication No. 2012/0033488

SUMMARY OF THE INVENTION

Problems to be Solved by the Invention

An electronic device in which IoT and AI are combined is required to be miniaturized and lightweight. Miniaturization of an electronic component used in the electronic device is also required so that it can be stored in a narrow space. Thus, miniaturization of the electronic component has a problem of reducing its circuit scale without decreasing the processing capability. In addition, the electronic component also has a problem of low power due to miniaturization.

In AI, a detection effect that is excellent in extracting a feature from various information (such as an image, sound, and big data) by machine learning can be obtained. It has been known that information is processed by neural network in AI. The neural network includes multilayer perceptrons, and each perceptron includes a plurality of neurons. As a neuron, product-sum operation processing that imitates the function of a synapse has been known. It has been known that a product-sum operation circuit calculates the sum of products obtained by multiplying a plurality of input signals by weight coefficients. However, the arithmetic operation of a neuron is processed by digital arithmetic operation, causing a problem in that the logic scale increases. There is also a problem in that power consumption increases in proportion to the size of the logic scale.

In view of the above problems, an object of one embodiment of the present invention is to provide a semiconductor device having a novel structure. Alternatively, another object of one embodiment of the present invention is to provide a semiconductor device in which a neuron outputs an analog signal. Alternatively, another object of one embodiment of the present invention is to provide a semiconductor device that reduces power of the arithmetic operation of a neuron.

Note that the descriptions of these objects do not disturb the existence of other objects. One embodiment of the present invention does not need to achieve all the objects. Note that objects other than these objects will be apparent and can be derived from the descriptions of the specification, the drawings, the claims, and the like.

Note that the objects of one embodiment of the present invention are not limited to the above objects. The objects described above do not disturb the existence of other objects. The other objects are the ones that are not described above and will be described below. The objects not described above can be derived from and extracted from the description of the specification, the drawings, and the like by those skilled in the art. Note that one embodiment of the present invention is to solve at least one of the aforementioned objects and/or the other objects.

According to one embodiment of the present invention, in a semiconductor device including a neural network, the neural network includes a multilayer perceptron, a row decoder, and a column decoder. The perceptron includes a plurality of neurons. The neuron includes a synapse circuit and an activation function circuit. The synapse circuit includes a plurality of memory cells. The column decoder has a function in which address information for selecting a memory cell is different in every perceptron. The row decoder has a function in which a bit line selected by the address information for selecting the memory cell is shared by a plurality of perceptrons. The memory cell is supplied with a weight coefficient of an analog signal. The synapse circuit is supplied with an input signal of an analog signal. The memory cell has a function of multiplying the input signal by the weight coefficient. The memory cell has a function of converting the multiplied result into a first current. The synapse circuit has a function of generating a second current by adding a plurality of the first currents. The synapse circuit has a function of converting the second current into a first potential. The activation function circuit has a function of converting the first potential into a second potential by a ramp function. The semiconductor device is characterized in that the synapse circuit included in a neuron in the next stage is supplied with the second potential as an input signal.

In each of the above configurations, the synapse circuit further includes a signal line WD, a signal line WW, a signal line SL, a signal line RW, and a wiring COM. The memory cell includes a first transistor, a second transistor, and a first capacitor. The memory cell is electrically connected to the signal line WD, the signal line WW, the signal line SL, the signal line RW, and the wiring COM. A gate of the first transistor is electrically connected to the signal line WW. One of a source and a drain of the first transistor is electrically connected to the signal line WD. The other of the source and the drain of the first transistor is electrically connected to a gate of the second transistor and one electrode of the first capacitor. One of a source and a drain of the second transistor is electrically connected to the signal line SL. The other of the source and the drain of the second transistor is electrically connected to the wiring COM. The other electrode of the first capacitor is electrically connected to the signal line RW. A first node is formed by connecting the gate of the second transistor, the other of the source and the drain of the first transistor, and one electrode of the first capacitor with one another. The first node has a function of retaining the weight coefficient as a weight potential. The signal line RW has a function of supplying the input signal to the other electrode of the first capacitor. The first node has a function of being changed into a third potential by adding the input signal to the weight potential through the first capacitor. The gate of the second transistor is supplied with the third potential. The second transistor has a function of supplying the first current corresponding to the third potential. The semiconductor device is preferably characterized in that the second transistor has a function of multiplying the input signal by the weight coefficient and converting into the first current.

In each of the above configurations, the synapse circuit further includes a column output circuit, and the column output circuit includes an analog adder circuit, a first output terminal, and a wiring OREF. The analog adder circuit includes a current-voltage conversion circuit, an offset circuit, and a first source follower circuit. The current-voltage conversion circuit includes a first terminal and a second terminal. The offset circuit includes a second capacitor and a third transistor. The first source follower circuit includes a fourth transistor and a fifth transistor. The analog adder circuit is electrically connected to a plurality of the memory cells through the signal line SL. The first terminal is electrically connected to the signal line SL and one electrode of the second capacitor. The second terminal is electrically connected to the wiring OREF. The other electrode of the second capacitor is electrically connected to one of a source and a drain of the third transistor and a gate of the fourth transistor. One of a source and a drain of the fourth transistor is electrically connected to one of a source and a drain of the fifth transistor and the first output terminal. A second node is formed by connecting the other electrode of the second capacitor, the one of the source and the drain of the third transistor, and the gate of the fourth transistor with one another. The second current is generated by adding the first current flowing through a plurality of the second transistors connected to the signal line SL. The current-voltage conversion circuit generates the first potential by being supplied with the second current. The first potential is supplied to the one electrode of the second capacitor. The third transistor has a function of initializing the potential of the second node. The second node has a function of retaining the first potential supplied to the one electrode of the second capacitor after being initialized by the third transistor. The first source follower circuit has a function of converting the first potential into a fourth potential. The semiconductor device is preferably characterized in that the first output terminal outputs the fourth potential.

In each of the above configurations, the synapse circuit further includes an offset current circuit. The offset current circuit includes a current sink circuit, a current supply circuit, a signal line ORM, a signal line OSM, a signal line ORP, a signal line OSP, and a wiring VDD. The current sink circuit includes a sixth transistor, a seventh transistor, an eighth transistor, and a third capacitor. The current supply circuit includes a ninth transistor, a tenth transistor, an eleventh transistor, and a fourth capacitor. The current sink circuit, the current supply circuit, and the current-voltage conversion circuit are electrically connected to a plurality of the memory cells through the signal line SL. The signal line SL is electrically connected to one of a source and a drain of the sixth transistor and one of a source and a drain of the ninth transistor. The one of the source and the drain of the sixth transistor is further electrically connected to one of a source and a drain of the seventh transistor. A gate of the sixth transistor is electrically connected to one electrode of the third capacitor, the other of the source and the drain of the seventh transistor, and one of a source and a drain of the eighth transistor. The other of the source and the drain of the eighth transistor is electrically connected to the wiring COM, the other of the source and the drain of the sixth transistor, and the other electrode of the third capacitor. A gate of the seventh transistor is electrically connected to the wiring OSP. A gate of the eighth transistor is electrically connected to the wiring ORP. The one of the source and the drain of the ninth transistor is further electrically connected to one of a source and a drain of the tenth transistor. A gate of the ninth transistor is electrically connected to one electrode of the fourth capacitor, the other of the source and the drain of the tenth transistor, and one of a source and a drain of the eleventh transistor. The other of the source and the drain of the eleventh transistor is electrically connected to the wiring VDD, the other of the source and the drain of the ninth transistor, and the other electrode of the fourth capacitor. A gate of the tenth transistor is electrically connected to the wiring OSM. The semiconductor device is preferably characterized in that a gate of the eleventh transistor electrically connected to the wiring ORM.

In each of the above configurations, the synapse circuit further includes a current mirror circuit. The current mirror circuit has a function of supplying a constant current through the signal line SL. The signal line RW is supplied with an initial potential. The first node is supplied with the weight potential. The second transistor has a function of outputting an offset current by the weight potential supplied to the first node. The current supply circuit has a function of supplying current for canceling the offset current. The semiconductor device is preferably characterized in that the current sink circuit has a function of sinking current for canceling the offset current.

In each of the above configurations, the activation function circuit includes a second source follower circuit, a second output terminal, a wiring OBS, a wiring NB1, and a wiring VDD. The second source follower circuit includes a twelfth transistor, a thirteenth transistor, and a fourteenth transistor. A gate of the twelfth transistor is electrically connected to the wiring NB1. A gate of the thirteenth transistor is electrically connected to the first output terminal. A gate of the fourteenth transistor is electrically connected to the wiring OBS. The second output terminal is electrically connected to one of a source and a drain of the twelfth transistor, one of a source and a drain of the thirteenth transistor, and one of a source and a drain of the fourteenth transistor. The other of the source and the drain of the twelfth transistor is electrically connected to the wiring COM. The other of the source and the drain of the fourteenth transistor and the other of the source and the drain of the thirteenth transistor are electrically connected to the wiring VDD. The second source follower circuit functions as the ramp function. The ramp function includes a first output range and a second output range. The twelfth transistor has a function of ensuring a constant current. The gate of the fourteenth transistor is supplied with a fifth potential through the wiring OBS. The gate of the thirteenth transistor is supplied with the fourth potential through the first output terminal. In the first output range, the second potential which is lower than the fifth potential by a first threshold voltage of the thirteenth transistor is output to the second output terminal. In the second output range, the second potential which is lower than the fourth potential by a second threshold voltage of the thirteenth transistor is output to the second output terminal. The semiconductor device is preferably characterized in that the activation function circuit outputs the second potential at which the neuron in the next stage can perform arithmetic operation.

In each of the above configurations, the activation function circuit includes an analog adder circuit, the wiring OREF, a wiring NB2, and a third output terminal. The analog adder circuit includes a current-voltage conversion circuit, a fifth capacitor, an offset circuit, and a comparison circuit. The offset circuit includes a transistor 15. The comparison circuit includes a third terminal and a fourth terminal. One electrode of the fifth capacitor is electrically connected to the signal line SL. The other electrode of the fifth capacitor is electrically connected to the third terminal. The fourth terminal is electrically connected to the wiring NB2. An output of the comparison circuit is electrically connected to the third output terminal. A third node is formed by connecting the other electrode of the fifth capacitor, one of a source and a drain of a fifteenth transistor, and the third terminal with one another. The wiring NB2 is supplied with a determination threshold potential. The second current is generated by adding the first current flowing through the plurality of second transistors connected to the signal line SL. The current-voltage conversion circuit generates the first potential by being supplied with the second current. The one electrode of the fifth capacitor is supplied with the first potential. The fifteenth transistor has a function of initializing a potential of the third node. The third node has a function of retaining the first potential supplied to the one electrode of the fifth capacitor after being initialized by the fifteenth transistor. The comparison circuit has a function of determining that firing occurs when the first potential is larger than the determination threshold potential. The comparison circuit has a function of determining that firing does not occur when the first potential is smaller than the determination threshold potential. The third output terminal has a function of outputting a digital signal "H" when it is determined that firing occurs. The third output terminal has a function of outputting a digital signal "L" when it is determined that firing does not occur. A semiconductor device is preferably characterized in that determination result of firing is output as the second potential at which the neuron in the next stage can perform arithmetic operation. Note that the semiconductor device is preferably character-ized in that the current-voltage conversion circuit includes one or a plurality of resistors.

In each of the semiconductor device with the above configurations, the first transistor, the third transistor, the fourth transistor, the fifth transistor, the seventh transistor, the eighth transistor, the tenth transistor, the eleventh transistor, the twelfth transistor, the thirteenth transistor, the fourteenth transistor, or the fifteenth transistor preferably includes a metal oxide in a semiconductor layer. The semiconductor device is preferably characterized in that the first transistor, the third transistor, the fourth transistor, the fifth transistor, the seventh transistor, the eighth transistor, the tenth transistor, the eleventh transistor, the twelfth transistor, the thirteenth transistor, the fourteenth transistor, or the fifteenth transistor includes a back gate.

In each of the above configurations, an electronic component characterized by including a lead electrically connected to the semiconductor device is preferable. An electronic device characterized by including a printed circuit board provided with the electronic component and a housing in which the printed circuit board is stored is preferable.

One embodiment of the present invention can provide a semiconductor device in which a neuron outputs an analog signal. Furthermore, one embodiment of the present invention can provide a semiconductor device that reduces power of the arithmetic operation of a neuron.

Note that the effects of one embodiment of the present invention are not limited to the effects described above. The effects described above do not disturb the existence of other effects. Note that the other effects are the ones that are not described above and will be described below. The effects not described above can be derived from and extracted from the description of the specification, the drawings, and the like by those skilled in the art. Note that one embodiment of the present invention is to have at least one of the aforementioned effects and/or the other effects. Accordingly, one embodiment of the present invention does not have the aforementioned effects in some cases.

MODE FOR CARRYING OUT THE INVENTION

Figure 1:
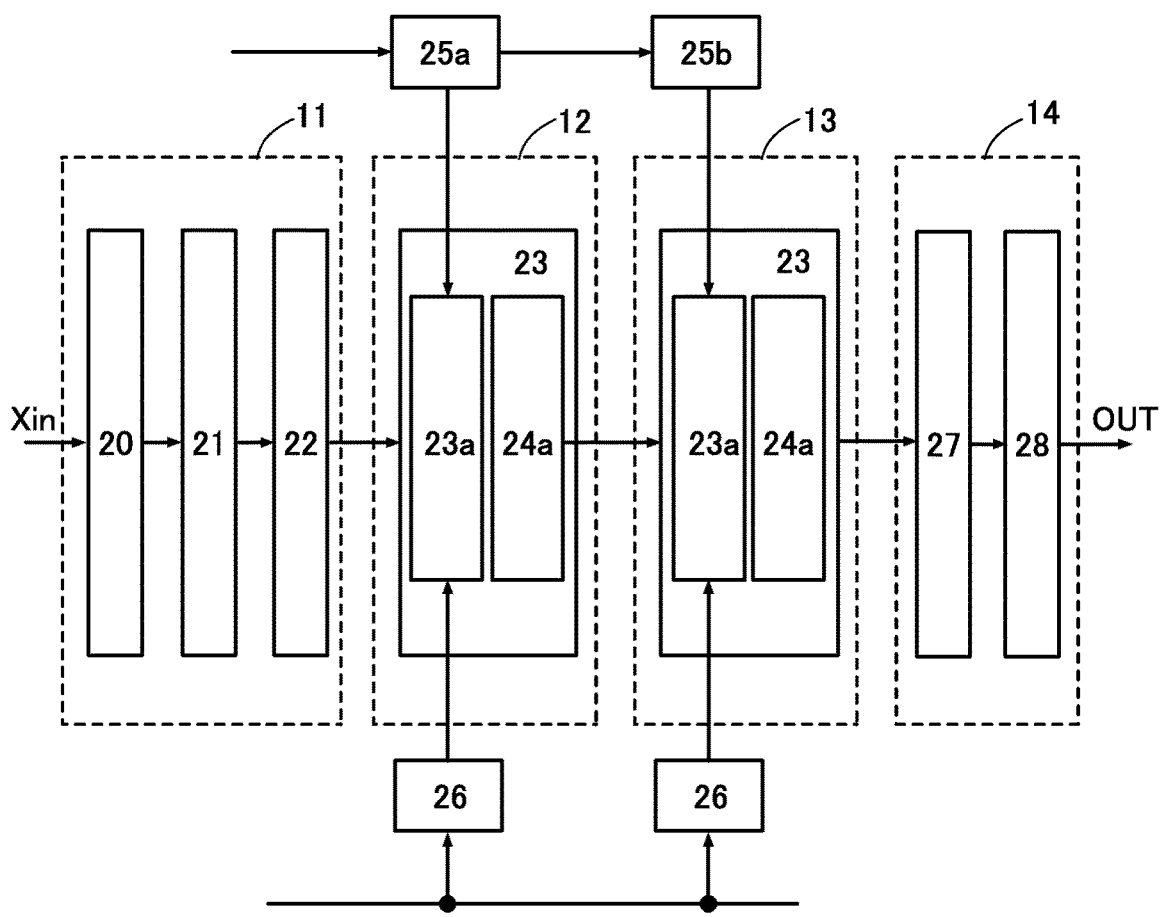
FIG. 1 A block diagram illustrating a semiconductor device.

Embodiments will be described below with reference to drawings. However, the embodiments can be implemented in many different modes, and it is easily understood by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, they are not necessarily limited to the illustrated scale. Note that the drawings are schematic views showing ideal examples, and embodiments of the present invention are not limited to shapes, values or the like shown in the drawings.

Note that ordinal numbers such as "first", "second", and "third" used in this specification are used in order to avoid confusion among components, and the terms do not limit the components numerically.

In this specification, terms for describing arrangement, such as "over" and "under", are used for convenience to describe a positional relation between components with reference to drawings. Furthermore, the positional relation between components is changed as appropriate in accordance with a direction in which each component is illustrated. Thus, terms for the description are not limited to those used in this specification, and description can be made appropriately depending on the situation.

In this specification and the like, a transistor is an element having at least three terminals including a gate, a drain, and a source. The transistor has a channel region between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or the direction of current flow is changed in circuit operation, for example. Therefore, the terms of a source and a drain can be used interchangeably in this specification and the like.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "parallel" refers to a state where two straight lines are arranged such that the angle formed therebetween is greater than or equal to $-10°$ and less than or equal to $10°$. Accordingly, the case where the angle is greater than or equal to $-5°$ and less than or equal to $5°$ is also included. Moreover, "perpendicular" indicates a state where two straight lines are arranged such that the angle formed therebetween is greater than or equal to $80°$ and less than or equal to $100°$. Accordingly, the case where the angle is greater than or equal to $85°$ and less than or equal to $95°$ is also included.

In this specification and the like, the term "film" and the term "layer" can be interchanged with each other. For example, the term "conductive layer" can be changed into the term "conductive film" in some cases. Furthermore, for example, the term "insulating film" can be changed into the term "insulating layer" in some cases.

Unless otherwise specified, off-state current in this specification and the like refers to a drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes means a drain current at the time when the voltage Vgs between its gate and source is lower than the threshold voltage Vth.

The off-state current of a transistor depends on Vgs in some cases. Thus, the off-state current of a transistor is lower than or equal to 1 sometimes means that there is Vgs with which the off-state current of the transistor becomes lower than or equal to 1. The off-state current of a transistor sometimes refers to the off-state current in an off state at predetermined Vgs, in an off state at Vgs in a predetermined range, in an off state at Vgs with which sufficiently reduced off-state current is obtained, or the like.

As an example, the assumption is made of an n-channel transistor where the threshold voltage Vth is 0.5 V, and the drain current is $1\times10^{-9}$ A at Vgs of 0.5 V, the drain current is $1\times10^{-13}$ A at Vgs of 0.1 V, the drain current is $1\times10^{-19}$ A at Vgs of $-0.5$ V, and the drain current is $1\times10^{-22}$ A at Vgs of $-0.8$ V. The drain current of the transistor is lower than or equal to $1\times10^{-19}$ A at Vgs of $-0.5$ V or at Vgs in the range of $-0.5$ V to $-0.8$ V; therefore, it is sometimes said that the off-state current of the transistor is lower than or equal to $1\times10^{-19}$ A. Since there is Vgs at which the drain current of the transistor is lower than or equal to $1\times10^{-22}$ A, it is sometimes said that the off-state current of the transistor is lower than or equal to $1\times10^{-22}$ A.

Furthermore, in this specification and the like, the off-state current of a transistor with a channel width W is sometimes represented by a current value per channel width W. Alternatively, it is sometimes represented by the value of flowing current per given channel width (e.g., 1 µm). In the latter case, the off-state current is sometimes represented by the unit with the dimension of current per length (e.g., A/µm).

The off-state current of a transistor depends on temperature in some cases. Unless otherwise specified, the off-state current in this specification is sometimes off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The off-state current of the transistor being lower than or equal to 1 sometimes means that there is Vgs at which the off-state current of a transistor is lower than or equal to 1 at room temperature, 60° C., 85° C., 95° C., 125° C., a temperature at which reliability of a semiconductor device or the like including the transistor is ensured, or a temperature at which the semiconductor device or the like including the transistor is used (e.g., any temperature in the range of 5° C. to 35° C.).

The off-state current of a transistor depends on voltage Vds between its drain and source in some cases. Unless otherwise specified, the off-state current in this specification sometimes refers to off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds used in the semiconductor device or the like including the transistor. The off-state current of the transistor being lower than or equal to 1 sometimes means that there is Vgs at which the off-state current of a transistor is lower than or equal to 1 at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device or the like including the transistor is ensured, or at Vds used in the semiconductor device or the like including the transistor.

In the above description of off-state current, a drain may be replaced with a source. That is, the off-state current sometimes means current that flows through a source of a transistor in an off state.

In this specification and the like, leakage current sometimes expresses the same meaning as off-state current. Furthermore, in this specification and the like, the off-state current sometimes refers to current that flows between a source and a drain of a transistor in an off state, for example.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, a semiconductor device having a function of a neural network will be described with reference to FIG. 1 to FIG. 8.

FIG. 1 is a block diagram illustrating a configuration of a semiconductor device 10.

The semiconductor device 10 includes an input layer 11, an intermediate layer 12, an output layer 13, an output circuit 14, a column decoder 25a, a column decoder 25b, and a row decoder 26. The input layer 11 includes an input register circuit 20, an input selector circuit 21, and a digital-analog conversion circuit 22. The intermediate layer 12 and the output layer 13 each include a neuron 23. The neuron 23 includes a synapse circuit 23a and an activation function circuit 24a. The synapse circuit 23a includes a memory unit. The output circuit 14 includes an analog-digital conversion circuit 27 and an output register 28.

The semiconductor device 10 can constitute a neural network including multilayer perceptrons. Thus, the input layer 11, the intermediate layer 12, and the output layer 13 can each function as a perceptron.

First, the intermediate layer 12 is described. The intermediate layer 12 preferably includes a plurality of neurons 23. The neuron 23 includes the synapse circuit 23a and the activation function circuit 24a. The synapse circuit 23a includes a memory unit. The memory unit includes a plurality of memory cells. The column decoder 25a and the row decoder 26, or the column decoder 25b and the row decoder 26 can select memory cells. The column decoder 25a or the column decoder 25b can select address information that is different in every perceptron. The row decoder 26 can select a bit line selected by the address information which is shared by a plurality of perceptrons. The column decoder 25a or the column decoder 25b preferably includes a digital-analog conversion circuit. The column decoder 25a or the column decoder 25b can write a first analog signal into memory cells through the digital-analog conversion circuit. The memory unit will be described in detail in FIG. 3.

The first analog signal supplied to the plurality of memory cells can be held as a weight coefficient.

In the perceptron of the input layer 11, the input register circuit 20 corresponds to the neuron 23. Input data is written into the input register circuit 20. The input data is supplied to the digital-analog conversion circuit 22 through the input selector circuit 21. The input data is converted into a second analog signal by the digital-analog conversion circuit 22. The second analog signal is supplied to the synapse circuit 23a of the neuron 23 included in the intermediate layer 12 as an input signal.

The synapse circuit 23a can multiply the input signal by the weight coefficient and convert the multiplied result into a first current. The synapse circuit 23a adds a plurality of first currents and generates a second current. A first potential is generated by converting the second current into voltage.

The activation function circuit 24a can convert the first potential into a second potential by a ramp function. The second potential can be output as an output signal of the neuron 23. The output signal of the intermediate layer 12 can be supplied as an input signal of the neuron 23 in the output layer 13. The operation of the neuron 23 in the output layer 13 is the same as that of the intermediate layer 12; thus, description thereof is omitted.

The second potential generated by the activation function circuit 24a of the output layer 13 is converted into a digital signal by the analog-digital conversion circuit 27 included in the output circuit 14. The digital signal is held in the output register 28 and used in a processor included in an electronic device.

Figure 2:
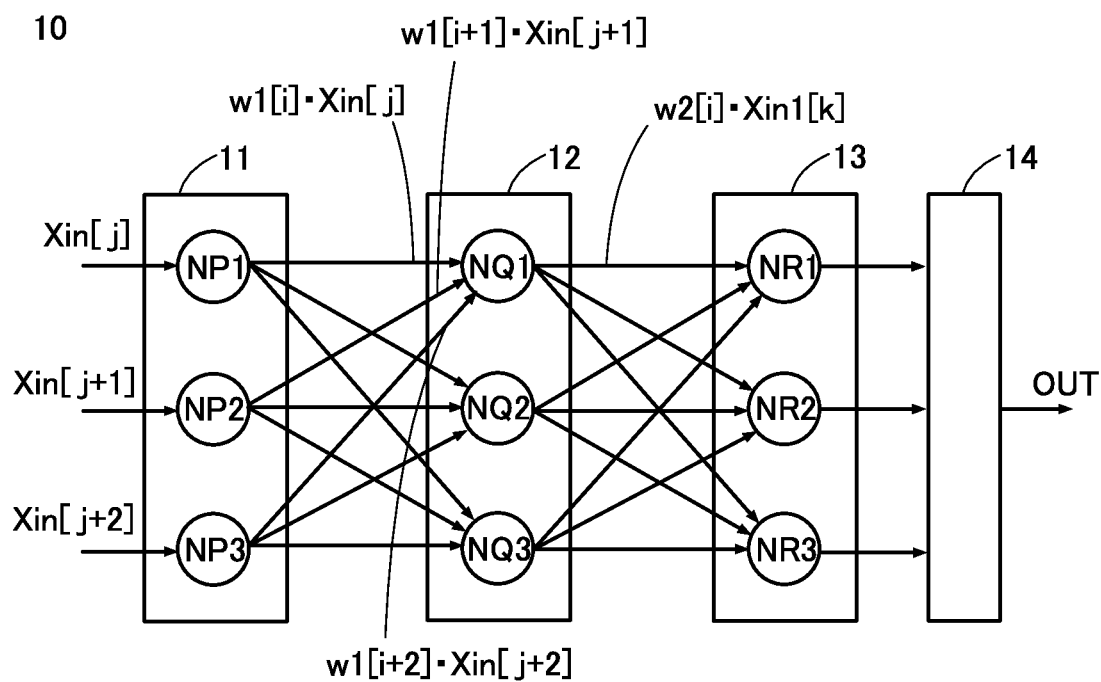
FIG. 2 A block diagram illustrating a neural network.

In FIG. 2, the semiconductor device 10 is illustrated in a schematic diagram of a neural network. The neural network includes the input layer 11, the intermediate layer 12, and the output layer 13, and each layer includes a perceptron. Although FIG. 2 illustrates an example in which the perceptron includes three neurons, the number of neurons is not limited to three. The perceptron can include m neurons. Note that m is an integer greater than or equal to 1. Alternatively, the perceptrons may include different numbers of neurons. The hierarchies of the perceptrons are not limited to the input layer 11, the intermediate layer 12, and the output layer 13. The intermediate layer 12 may have a plurality of hierarchies. For example, the perceptrons can include hierarchies the number of which is greater than or equal to 1 and less than or equal to s. Note that s is an integer greater than or equal to 2.

Next, the flow of signals in the neural network is described. A neuron NP1 in the input layer 11 is supplied with the second analog signal as an input signal Xin[j]. The input signal Xin[j] supplied to the input layer 11 is supplied to a neuron NQ1 to a neuron NQ3 in the intermediate layer 12. The outputs of the neuron NQ1 to the neuron NQ3 in the intermediate layer 12 are supplied to a neuron NR1 to a neuron NR3 in the output layer 13. Note that j is a variable showing the number of a neuron and is an integer greater than or equal to 1.

Here, for description, the neuron NQ1 included in the intermediate layer 12 is described. The synapse circuit 23a can multiply the input signal Xin[j] supplied to the neuron NP1 by a weight coefficient w[i]. The synapse circuit 23a can multiply the neuron NP2 and the neuron NP3 in a manner similar to that of the neuron NP1. The synapse circuit 23a can add the multiplication results. The addition result is determined by the activation function circuit 24a. The activation function circuit 24a includes a logistic sigmoid function. The logistic sigmoid function can be represented as a variable P. Thus, an input signal Xin 1 of the neuron NQ1 can be represented by Formula 1. Note that i is a variable that shows a memory cell in which the weight coefficient of the synapse circuit is held and is an integer greater than or equal to 1.

$$Xin1 = P \cdot \Sigma(w1[i] \cdot Xin[j])$$ (Formula 1)

The activation function circuit 24a is described in detail in FIG. 6. FIG. 6 illustrates an example in which an output signal converted by a ramp function is output. FIG. 7 illustrates an example in which an output is performed differently from the output in FIG. 6. The output from the activation function circuit 24a can be supplied as an input signal with which the neuron 23 in the next stage can perform arithmetic operation.

Figure 3:
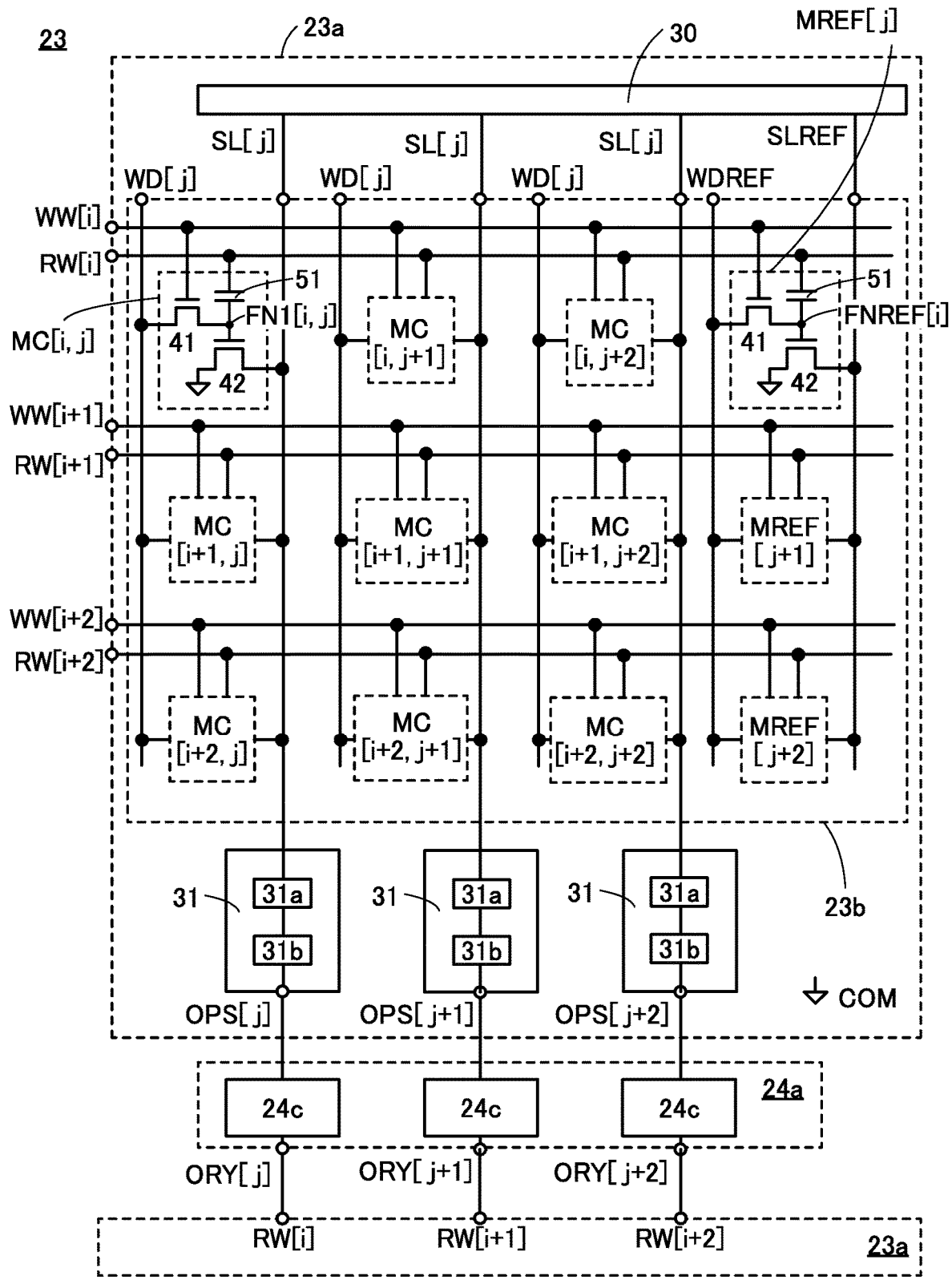
FIG. 3 A block diagram illustrating a semiconductor device.

FIG. 3 illustrates an example of the neuron 23. The neuron 23 includes the synapse circuit 23a and the activation function circuit 24a. The synapse circuit 23a includes a memory unit 23b, a current source circuit 30, a column output circuit 31, a signal line WD[j], a signal line WW[i], a signal line SL[j], a signal line RW[i], and a wiring COM. The column output circuit 31 includes a current-voltage conversion circuit 31a, an offset circuit 31b, a first output terminal, and a wiring OREF.

The memory unit 23b includes a plurality of memory cells MC. The memory cell MC includes a transistor 41, a transistor 42, and a capacitor 51. In FIG. 3, description is made using the memory cell MC[i,j] to the memory cell MC[i+2,j+2] as an example for simplicity.

The memory cell MC is electrically connected to the signal line WD[j], the signal line WW[i], the signal line SL[j], the signal line RW[i], and the wiring COM. A gate of the transistor 41 is electrically connected to the signal line WW. One of a source and a drain of the transistor 41 is electrically connected to the signal line WD. The other of the source and the drain of the transistor 41 is electrically connected to a gate of the transistor 42 and one electrode of the capacitor 51. One of a source and a drain of the transistor 42 is electrically connected to the signal line SL. The other of the source or the drain of the transistor 42 is electrically connected to the wiring COM. The other electrode of the capacitor 51 is electrically connected to the signal line RW. A node FN1 is formed by connecting the gate of the transistor 42, the other of the source and the drain of the transistor 41, and the one electrode of the capacitor 51.

The memory cell MC can retain the weight coefficient in the node FN1. The weight coefficient, which is supplied as an analog signal, can be expressed as a weight potential. The signal line RW is supplied with an input signal of an analog signal. Thus, as for the capacitor 51, the other electrode of the capacitor 51 is supplied with the input signal. The potential of the node FN1 is changed to a third potential by addition of the input signal to the weight potential through the capacitor 51. Thus, the third potential is supplied to the gate of the transistor 42. By changing the third potential supplied to the gate of the transistor 42, the transistor 42 can supply current corresponding to the conductance of the transistor 42. That is, the transistor 42 can multiply the input signal by the weight coefficient and convert the result into the first current. Accordingly, the multiplied result is output as the first current. The wiring COM is preferably supplied with the lowest potential used in the synapse circuit 23a The current flowing through the transistor 42 preferably flows in the direction in which the current is sunk in the wiring COM.

The synapse circuit 23a includes the current source circuit 30 that supplies current to the signal line SL[j]. The current source circuit 30 can generate a current IREF with the use of a plurality of memory cells MREF included in the memory unit 23b. The current IREF is a reference current when current is supplied to the signal line SL[j]. The current source circuit 30 includes a current mirror circuit and can copy the current IREF into a current IR[j]. Thus, the current IR[j] as large as the current IREF can be supplied to the signal line SL[j]. The current source circuit 30 will be described in detail in FIG. 4.

The column output circuit 31 is electrically connected to the plurality of memory cells MC through the signal line SL[j]. FIG. 3 illustrates an example in which the memory cell MC[i,j] to the memory cell MC[i+2,j] are connected to the signal line SL[j]. The second current is generated by adding the first current flowing through the second transistor included in each of the memory cell MC[i,j] to the memory cell MC[i+2,j]. That is, the synapse circuit 23a has a function of product-sum operation.

The current-voltage conversion circuit 31a can convert the second current flowing through the signal line SL[j] into the first potential. The first potential is supplied to the offset circuit 31b. Assuming as a basis the case where input signals are not supplied to the memory cell MC[i,j] to the memory cell MC[i+2,j], the offset circuit 31b can retain the first potential when input signals are supplied. The offset circuit 31b outputs a fourth potential generated from the first potential to the first output terminal. The column output circuit 31 will be described in detail in FIG. 5.

The activation function circuit 24a can convert the fourth potential into the second potential by a ramp function. The second potential is supplied to a signal line RW included in the neuron 23 in the next stage. The activation function circuit 24a will be described in detail in FIG. 6.

Figure 4:
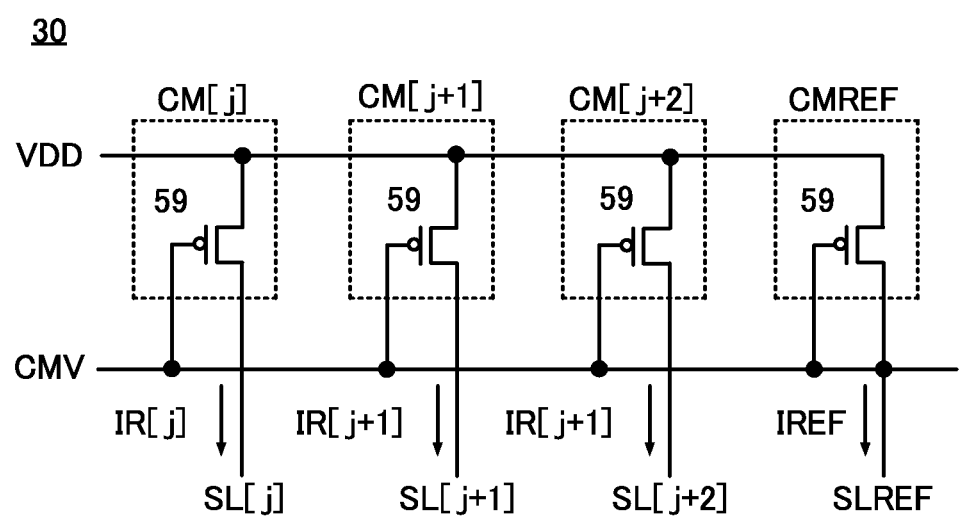
FIG. 4 A circuit diagram illustrating a semiconductor device.

The current source circuit 30 is described in detail in FIG. 4. FIG. 4 illustrates an example of a circuit configuration of the current source circuit 30. The current source circuit 30 is composed of current mirror circuits. The current mirror circuits include a current mirror circuit CMREF which is used as a reference and a plurality of current mirror circuits CM. The number of current mirror circuits CM is preferably the same as the number of neurons 23. The current mirror circuit CMREF and the current mirror circuit CM[j] each include a p-channel transistor 59. The transistors 59 preferably have the same channel lengths, channel widths, and electrical characteristics. As long as the same amount of current can be supplied through the signal line SL[j], the current source circuit 30 is not limited to the current mirror circuits including a p-channel transistor as described in the example in FIG. 4.

A source of the transistor 59 included in each of the current mirror circuit CMREF and the current mirror circuit CM[j] is electrically connected to a wiring VDD. A gate of the transistor 59 is electrically connected to a wiring CMV. A drain of the transistor 59 is electrically connected to the signal line SL[j]. The current mirror circuit CMREF is electrically connected to the gate and the drain of the transistor 59. The current mirror circuit CMREF is electrically connected to the memory cells MREF through a signal line SLREF.

The current IREF corresponding to the sum of currents flowing through the transistors 42 included in the memory cells MREF flows through the signal line SLREF. Thus, the drain potential and the gate potential of the transistor 59 included in the current mirror circuit CMREF are determined by the current IREF. The potential supplied to the gate of the transistor 59 included in the current mirror circuit CMREF is supplied to the gates of the transistors 59 included in the current mirror circuits CM through the wiring CMV. Thus, the currents IR[j] as large as the current IREF are supplied.

Figure 5:
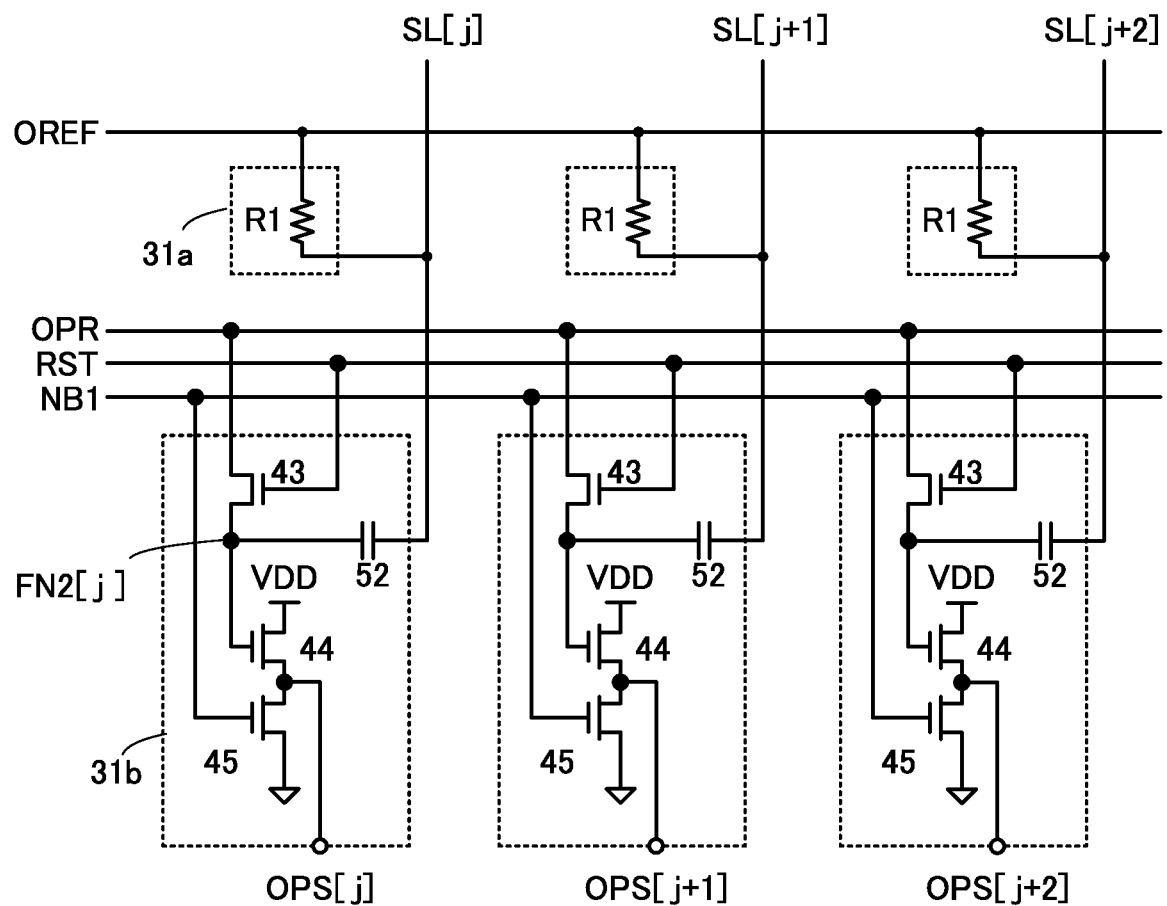
FIG. 5 A circuit diagram illustrating a semiconductor device.

The column output circuit 31 is described in detail in FIG. 5. The column output circuit 31 includes the current-voltage conversion circuit 31a, the offset circuit 31b, the wiring OREF, a wiring OPR, a signal line RST, and a wiring NB 1.

First, the current-voltage conversion circuit 31a is described. An example in which a resistor R1 is used in the current-voltage conversion circuit 31a is shown. One electrode of the resistor R1 is electrically connected to the signal line SL[j]. The plurality of memory cells MC are preferably electrically connected to the signal line SL[j]. The wiring OREF is electrically connected to the other electrode of the resistor R1. The resistor R1 can convert the second current into a first potential using a potential VREF supplied to the wiring OREF as a reference potential. Note that the most appropriate potential VREF can be supplied to the potential VREF in consideration of the weight potential supplied to the node FN1 and the input signal supplied to the signal line RW.

Although an example in which the current-voltage conversion circuit 31a converts current into voltage with one resistor is shown, a plurality of resistors and a switch may be included. The current-voltage conversion circuit 31a can switch the detection range in accordance with the amount of current by including the plurality of resistors and the switch. Note that the currents flowing through the plurality of memory cells MC are supplied to the signal line SL[j] as a resultant current. Thus, the column output circuit 31 functions as an analog adder circuit.

For example, it is preferable that the potential VREF supplied to the wiring OREF be set so that the first potential shows a positive potential when the node FN1 is supplied with either a positive weight potential or a negative weight potential. Thus, the first current flowing through the transistor 42 is preferably sunk in the wiring COM when the node FN1 is supplied with either a positive weight potential or a negative weight potential. However, the potential VREF may be set so that the first current is sunk in the wiring COM in the case of a positive weight potential and is supplied from the wiring COM in the case of a negative weight potential. Furthermore, in the current source circuit 30, the IR[j] supplied to the signal line SL[j] is preferably larger than the second current.

Next, the offset circuit 31b is described. The offset circuit 31b includes a reset circuit, a first source follower circuit, and the first output terminal. The reset circuit includes a capacitor 52 and a transistor 43. The first source follower circuit includes a transistor 44 and a transistor 45.

The offset circuit 31b is electrically connected to the wiring OPR, the signal line RST, and the wiring NB. One electrode of the capacitor 52 is electrically connected to the signal line SL[j]. The other electrode of the capacitor 52 is electrically connected to one of a source and a drain of the transistor 43 and a gate of the transistor 44. The other of the source and the drain of the transistor 43 is electrically connected to the wiring OPR. One of a source and a drain of the transistor 44 is electrically connected to the wiring VDD. The other of the source and the drain of the transistor 44 is electrically connected to one of a source and a drain of the transistor 45 and an output terminal OPS[j]. The other of the source and the drain of the transistor 45 is electrically connected to the wiring COM. A gate of the transistor 45 is electrically connected to the wiring NB1. A node FN2 is formed by connecting the other electrode of the capacitor 52, the one of the source and the drain of the transistor 43, and the gate of the transistor 44.

The wiring OPR is supplied with a reset potential VPR of the node FN2. The reset circuit can turn on the transistor 43 by supplying the signal line RST with a digital signal "H". Thus, the node FN2 is supplied with the potential VPR. The node FN2 has a first period in which the reset potential VPR is supplied. It is preferable that the signal line SL[j] is not supplied with the input data with respect to the memory cell MC in the first period.

When the transistor 43 is turned off, the input signal is supplied from the signal line RW to the memory cell MC. The one electrode of the capacitor 52 is supplied with the first potential generated by the current voltage conversion circuit 31a from the second current. The potential of the node FN2 is changed to the first potential by capacitive coupling by the capacitor 52. The first potential supplied to the node FN2 is supplied to the gate of the transistor 44 included in the first source follower circuit. The gate of the transistor 45 is supplied with a fixed potential by the wiring NB1. Thus, the transistor 45 can function as a constant current source of the first source follower circuit. The transistor 44 and the transistor 45 preferably have the same channel lengths, channel widths, and electric characteristics.

The output terminal OPS[j] is supplied with an output of the first source follower circuit. Thus, the output terminal OPS[j] outputs the fourth potential which is lower than the first potential supplied to the gate of the transistor 44 by a threshold voltage of the transistor 44.

Figure 6A:
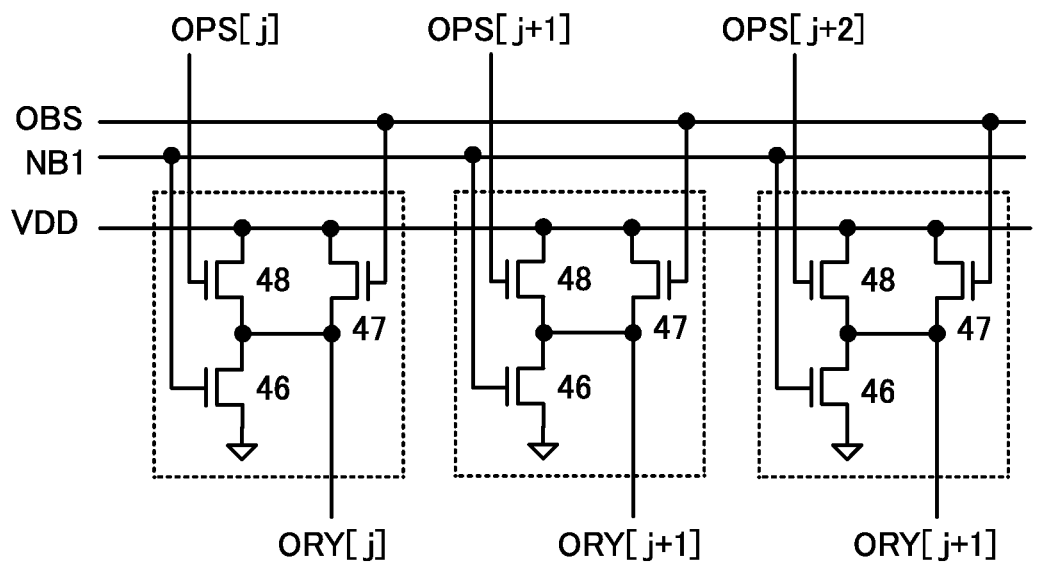
FIG. 6 (A) A circuit diagram illustrating a semiconductor device. (B) A circuit diagram illustrating output characteristics of a semiconductor device.

The activation function circuit 24a is described in detail in FIG. 6(A). In a neural network, an activation function circuit is sometimes referred to as a logistic sigmoid function. The activation function circuit 24a includes a second source follower circuit, a wiring VDD, a wiring OBS, and a wiring NB1. The second source follower circuit includes a transistor 46, a transistor 47, and a transistor 48.

A gate of the transistor 46 is electrically connected to the wiring NB1. A gate of the transistor 47 is electrically connected to the wiring OBS. The output terminal OPS[j] is electrically connected to a gate of the transistor 48. The wiring VDD is electrically connected to one of a source and a drain of the transistor 47 and one of a source and a drain of the transistor 48. One of a source and a drain of the transistor 46 is electrically connected to the other of the source and the drain of the transistor 47, the other of the source and the drain of the transistor 48, and an output terminal ORY[j]. The other of the source and the drain of the transistor 46 is electrically connected to the wiring COM.

The activation function circuit 24a can convert the fourth potential supplied from the column output circuit 31 through the output terminal OPS[j] into the second potential by a ramp function. The gate of the transistor 46 is supplied with a fixed potential by the wiring NB1. Thus, the transistor 46 can function as a constant current source of the second source follower circuit. The gate of the transistor 47 is supplied with a voltage VBS by the wiring OBS. The gate of the transistor 48 is supplied with the fourth potential. The transistor 46, the transistor 47, and the transistor 48 preferably have the same channel lengths, channel widths, and electric characteristics.

The ramp function includes a first output range and a second output range. In the first output range, the second potential is output to the output terminal ORY[j] by the transistor 47. In the second output range, the second potential is output to the output terminal ORY[j] by the transistor 48. Thus, in the first output range, the second potential which is lower than the voltage VBS by a threshold voltage of the transistor 47 is output to the output terminal ORY[j]. In the second output range, the second potential which is lower than the fourth potential by a threshold voltage of the transistor 48 is output to the output terminal ORY[j].

In other words, when the fourth potential is smaller than the voltage VBS, the ramp function of the activation function circuit 24a can fix the output voltage of the output terminal ORY[j]. When the fourth potential is larger than the voltage VBS, the output terminal ORY[j] can be changed to an output voltage corresponding to the fourth potential supplied to the gate of the transistor 48.

The arithmetic operation of the analog signals varies depending on the influence of the electrical characteristics of elements or the time constant of a wiring or the like, for example. However, the influence of the variation can be reduced by having the first output range. The second potential converted by the ramp function is supplied to the signal line RW as an input signal of a neuron in the next stage.

Figure 6B:
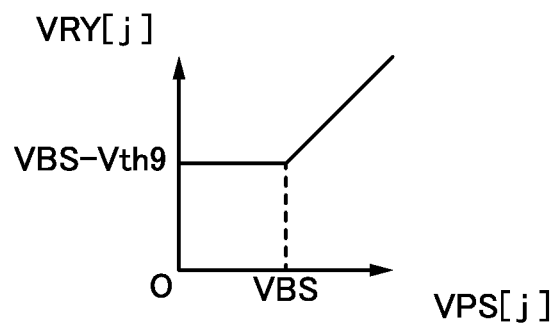

FIG. 6(B) shows output characteristics of the activation function circuit 24a. The x-axis represents the fourth potential supplied to the active function circuit 24a as an input signal. The y-axis represents a voltage VRY[j] supplied to the output terminal ORY[j] as an output signal of the activation function circuit 24a.

The fourth potential is compared with the voltage VBS supplied to the second source follower circuit. The first output range outputs when the fourth potential is smaller than the voltage VBS. Accordingly, it is indicated that the second potential which is lower than the voltage VBS by the threshold voltage of the transistor 47 is output to the output terminal ORY[j] in the first output range. The second output range outputs when the fourth potential is larger than the voltage VBS. Accordingly, it is indicated that the second potential which is lower than the fourth potential by the threshold voltage of the transistor 48 is output to the output terminal ORY[j] in the second output range.

Figure 7A:
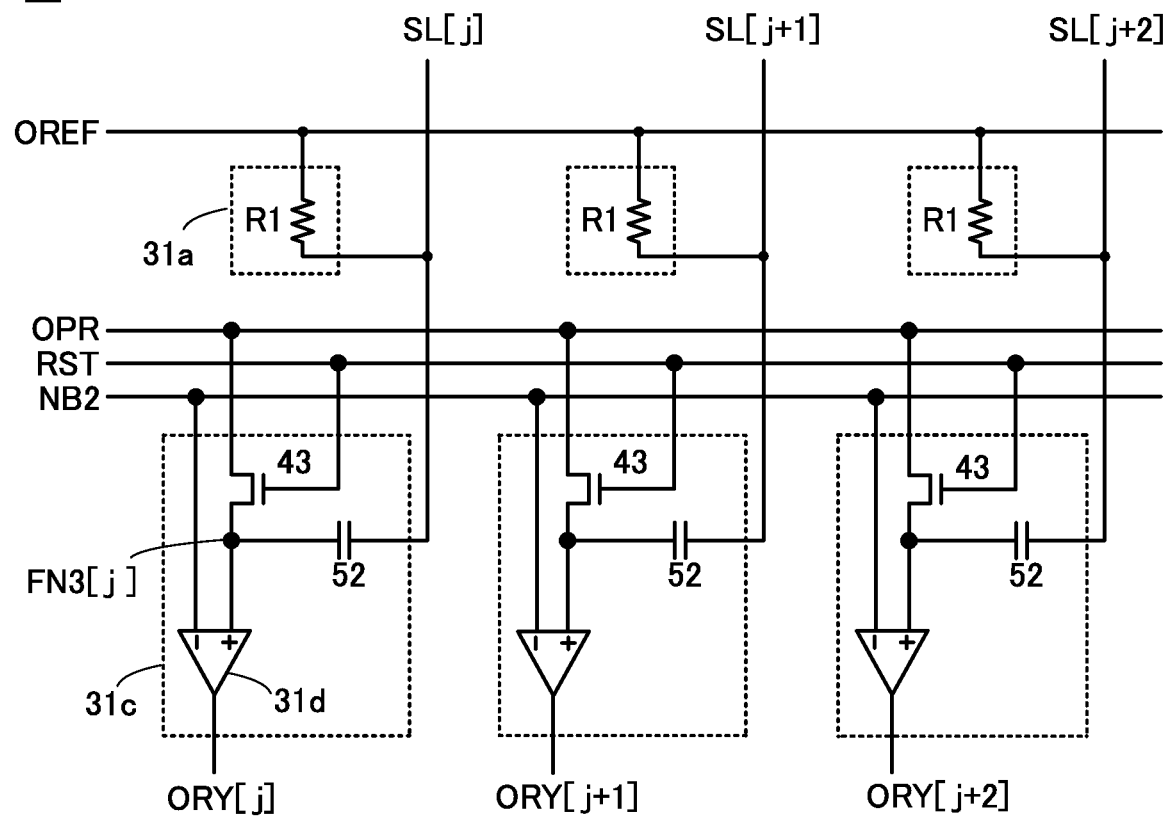
FIG. 7 (A) A circuit diagram illustrating a semiconductor device. (B) A circuit diagram illustrating output characteristics of a semiconductor device.

A different configuration of the column output circuit 31 is illustrated in FIG. 7(A). The column output circuit 31 in FIG. 7(A) is different in that an offset circuit 31c includes a function of the activation function. The offset circuit 31c includes the reset circuit, a comparison circuit 31d, the wiring OPR, the signal line RST, and a wiring NB2. The reset circuit includes the transistor 43 and the capacitor 52.

The comparison circuit 31d includes a first input terminal, a second input terminal, and an output terminal ORY.

One electrode of the capacitor 52 is electrically connected to the signal line SL[j]. The other electrode of the capacitor 52 is electrically connected to one of a source and a drain of the transistor 43 and the first input terminal of the comparison circuit 31d. The other of the source and the drain of the transistor 43 is electrically connected to the wiring OPR. A gate of the transistor 43 is electrically connected to the signal line RST. The second input terminal of the comparison circuit 31d is electrically connected to the wiring NB2. An output of the comparison circuit 31d is supplied to the output terminal ORY[j]. A node FN3 is formed by connecting the other electrode of the capacitor 52, the one of the source and the drain of the transistor 43, and the first input terminal of the comparison circuit 31d.

The operation of the reset circuit, which is described with reference to FIG. 5, is omitted. The node FN3 is supplied with a first potential. A determination threshold potential VNB is supplied from the wiring NB2 to the second input terminal of the comparison circuit 31d. Thus, the comparison circuit 31d can compare the first potential supplied to the first input terminal with the determination threshold potential VNB supplied to the second input terminal.

Therefore, the comparison circuit can determine that firing occurs when the first potential is larger than the determination threshold potential VNB. The comparison circuit can further determine that firing does not occur when the first potential is smaller than the determination threshold potential VNB. Determination result of firing is supplied to the signal line RW as an input signal of the neuron in the next stage.

Here, the state of firing is described. The neuron 23 adds the results obtained by multiplying the input signals by the weight coefficients. The added result is compared with the determination threshold potential VNB, so that it is determined whether the input signals have certain features. That is, firing refers to a state in which a digital signal "H" is output when it is determined that the operation result of the input signals have certain features. Therefore, firing is preferably determined by a different determination threshold potential VNB in each neuron 23. FIG. 7 illustrates an example in which the same determination threshold potentials VNB are supplied to the respective second input terminals of the comparison circuits 31d from the wiring NB2 which is used in common. Note that analog registers may be included so that the second input terminals can each hold a different determination threshold potential VNB in order that the neuron 23 extract features.

Figure 7B:
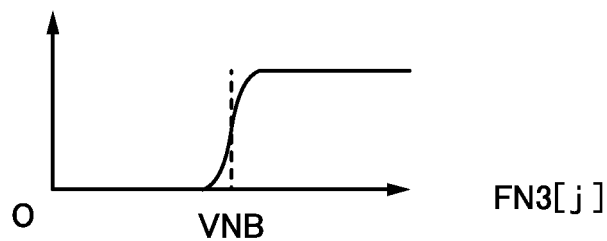

FIG. 7(B) shows output characteristics of the column output circuit 31 illustrated in FIG. 7(A). The x-axis represents the first potential which is supplied as an input signal and held in the node FN3. The y-axis represents a voltage VRY[j] supplied to the output terminal ORY[j] as an output signal of the column output circuit 31. Thus, when firing occurs, the digital signal "H" is output to the output terminal ORY[j] as the second potential. When firing does not occur, a digital signal "L" is output to the output terminal ORY[j] as the second potential.

Figure 8:
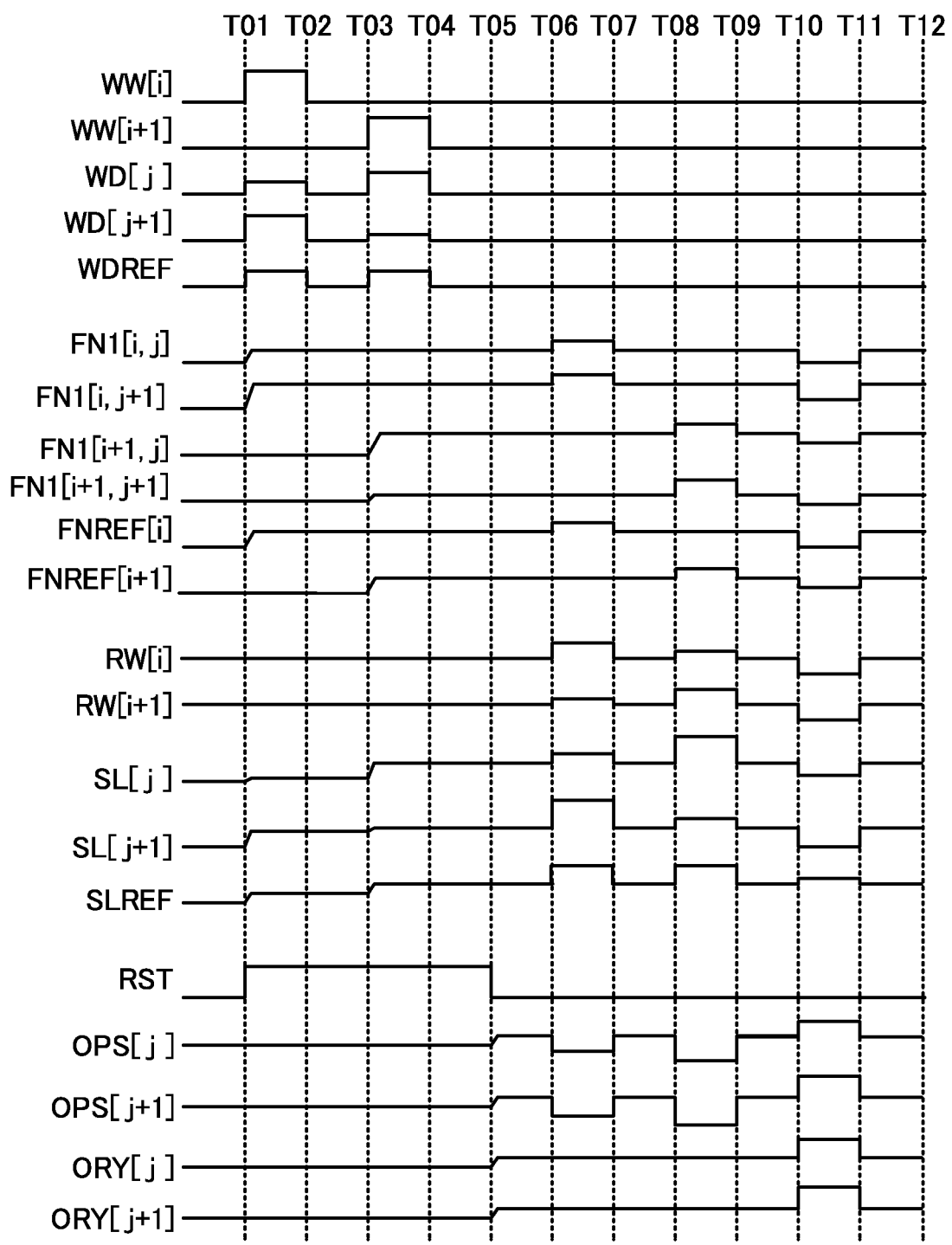
FIG. 8 A timing chart for driving a semiconductor device.

FIG. 8 is a timing chart showing an operation of the semiconductor device 10. In FIG. 8, operations of the memory cell MC[i,j] to the memory cell MC[i+1,j+1], the memory cell MREF[i], and the memory cell MREF[i+1] are described for simplicity.

A period from time T01 to time T04 is a step of storing the first analog signal in the memory cells MC.

Further, a period from the time T01 to time T05 is a step of setting a reset potential to the offset circuit 31b of the column output circuit 31.

A period from time T06 to time T1 is a step of executing the processing of the product-sum operation and the activation function in each hierarchy of multilayer perceptrons and obtaining an output of a multilayer neural network.

A period from the time T01 to time T02 is described. A signal line WDREF is supplied with a potential of an analog signal WST. The signal line WD[j] is supplied with a potential of an analog signal WST-VWX[i,j]. A signal line WD[j+1] is supplied with a potential of an analog signal WST-VWX[i,j+1]. The signal line RW[i] and a signal line RW[i+1] are each supplied with an analog signal VXST as a reference potential. The WST and the VXST are each supplied with an analog signal. Note that the memory cell MC[i,j] and the memory cell MC[i,j+1] are supplied with the potentials of the weight coefficients as the VWX[i,j] and the VWX[i,j+1], respectively.

Next, the signal line RST[i] is supplied with a digital signal "H". The signal line WW[i] is supplied with a digital signal "H". The signal line WW[i+1] is supplied with a digital signal "L".

Thus, the potential of the analog signal WST is held in a node FNREF[i]. The potential of the analog signal WST-VWX[i,i] is held in the node FN1[$i,j$]. The potential of the analog signal WST-VWX[i,j+1] is held in the node FN1[$i, j$+1].

A period from time T03 to the time T04 is described. The signal line WW[i] is supplied with a digital signal "L". The signal line WW[i+1] is supplied with a digital signal "H". The signal line WD[j] is supplied with the analog signal WST-VWX[i+1,j]. The signal line WD[j+1] is supplied with the analog signal WST-VWX[i+1,j+1]. The signal line WDREF is supplied with the analog signal WST. The signal line RW[i] and the signal line RW[i+1] are each supplied with the analog signal VXST as a reference potential. Note that the memory cell MC[i+1,j] and the memory cell MC[i+1,j+1] are supplied with the potentials of the weight coefficients as the VWX[i,j] and the VWX[i,j+1], respectively.

Then, the signal line WW[i] is supplied with a digital signal "L". The signal line WW[i+1] is supplied with a digital signal "L". Thus, the potential of the analog signal WST is held in the node FNREF[i+1]. The potential of the analog signal WST-VWX[i+1,j] is held in the node FN1[$i$+1,j]. The potential of the analog signal WST-VWX[i+1,j+1] is held in the node FN1[$i$+1,j+1].

A period from the time T01 to the time T05 is described. During the period from the time T01 to the time T05, the potentials of the node FN2[$j$] and the node FN2[$j$+1] are each kept at the potential of the analog signal VPR which is a reset potential.

The time T05 is described. At the time T05, the reset period of the offset circuit 31b is terminated when the signal line RST is supplied with a digital signal "L".

A period from time T06 to time T07 is described. The column output circuit 31[$j$] can output a data signal VPS[j] to the output terminal OPS[j] in accordance with the result of the product-sum operation. The activation function circuit 24a outputs an output signal VRY[j] converted from the data signal VPS[j] by a ramp function. During the period from time T06 to the time T07, an example in which the data signal VPS[j] is lower than the potential of the VBS is shown.

The column output circuit 31[$j$+1] can output a data signal VPS[j+1] in accordance with the result of the product-sum operation. Similarly, the data signal VPS[j+1] is converted by a ramp function and output as an output signal VRY[j+1]. During the period from the time T06 to the time T07, an example in which the data signal VPS[j+1] is lower than the potential of the VBS is shown.

Thus, the active function circuit 24a shows an example in which a fixed potential is output to the output signal VRY[j] and output signal VRY[j+1] which are converted by a ramp function. Therefore, the output signal VRY[j] and the output signal VRY[j+1] output, by a ramp function, a potential which is lower than the analog signal VBS by the threshold voltage of the transistor 47.

A period from time T08 to time T09 is described. The signal line RW[i] and the signal line RW[i+1] are supplied with input data different from those supplied in the period from the time T06 to the time T07. During the period from the time T08 to the time T09, an example in which the data signal VPS[j] and the data signal VPS[j+1] are lower than the potential of the VBS is shown.

Thus, the active function circuit 24a shows an example in which a fixed potential is output to the output signal VRY[j] and output signal VRY[j+1] which are converted by a ramp function. Therefore, the output signal VRY[j] and the output signal VRY[j+1] output, by a ramp function, a potential which is lower than the analog signal VBS by the threshold voltage of the transistor 47.

A period from time T10 to time T11 is described. The reading control line RW[i] and the signal line RW[i+1] are supplied with input data different from the input data described above. An example of the result of the product-sum operation of the column output function 31 in which the data signal VPS[j] and the data signal VPS[j+1] are higher than the potential of the VBS is shown.

The activation function circuit 24a outputs the output signal VRY[j] and the output signal VRY[j+1] in accordance with the result of the product-sum operation. Thus, the output signal VRY[j] outputs a potential lower than the data signal VPS[j] by the threshold voltage of the transistor 47. In addition, the output signal VRY[j+1] outputs a potential lower than the data signal VPS[j+1] by the threshold voltage of the transistor 47.

The activation function circuit 24a can convert the data signal VPS into the output signal VRY by a ramp function. Even when the weight coefficients held in the node FN1 are the same, different operation results can be output when input data are different. Thus, when this embodiment is applied to the neural network, the plurality of perceptrons can perform arithmetic operation efficiently with analog signals. In addition, when the arithmetic operation result is successively subjected to arithmetic operation with an analog signal without being digitized, efficient and high-speed arithmetic operation can be further provided.

Configuration Example of Memory Cell

Figure 9A:
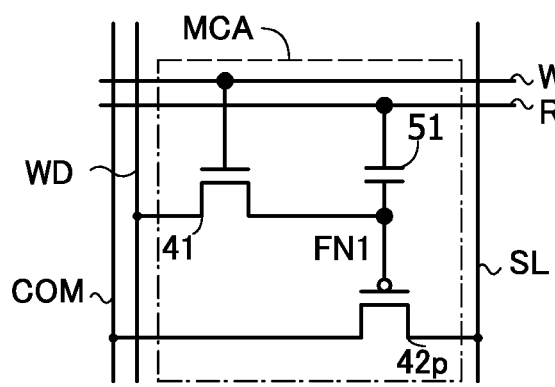
FIG. 9 Circuit diagrams illustrating a semiconductor device.
Figure 9B:
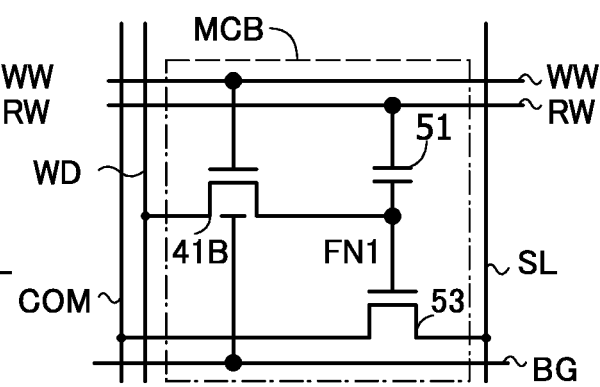

FIGS. 9(A) and 9(B) illustrate examples of a circuit configuration that the memory cell MC described with reference to FIG. 3 can have.

A memory cell MCA illustrated in FIG. 9(A) includes the transistor 41, a transistor 42p, and the capacitor 51. The transistor 42p is a p-channel transistor, the polarity of which is different from that of the transistor 41 which is an n-channel transistor. As illustrated in FIG. 9(A), a variety of polarities can be selected as the polarities of the transistors in the memory cells in FIG. 3.

A memory cell MCB illustrated in FIG. 9(B) includes a transistor 41B, a transistor 53, and the capacitor 51. The transistor 41B illustrated in FIG. 9(B) includes a back gate connected to a wiring BG. The transistor 41B can have a configuration in which the threshold voltage can be controlled by a potential supplied to the wiring BG.

The structure and method described above in this embodiment can be implemented in combination as appropriate with the structures and methods described in the other embodiments.

Embodiment 2

In this embodiment, a semiconductor device in which the synapse circuit included in the neuron further has a function of canceling an offset current will be described with reference to FIG. 10 to FIG. 14.

Figure 10:
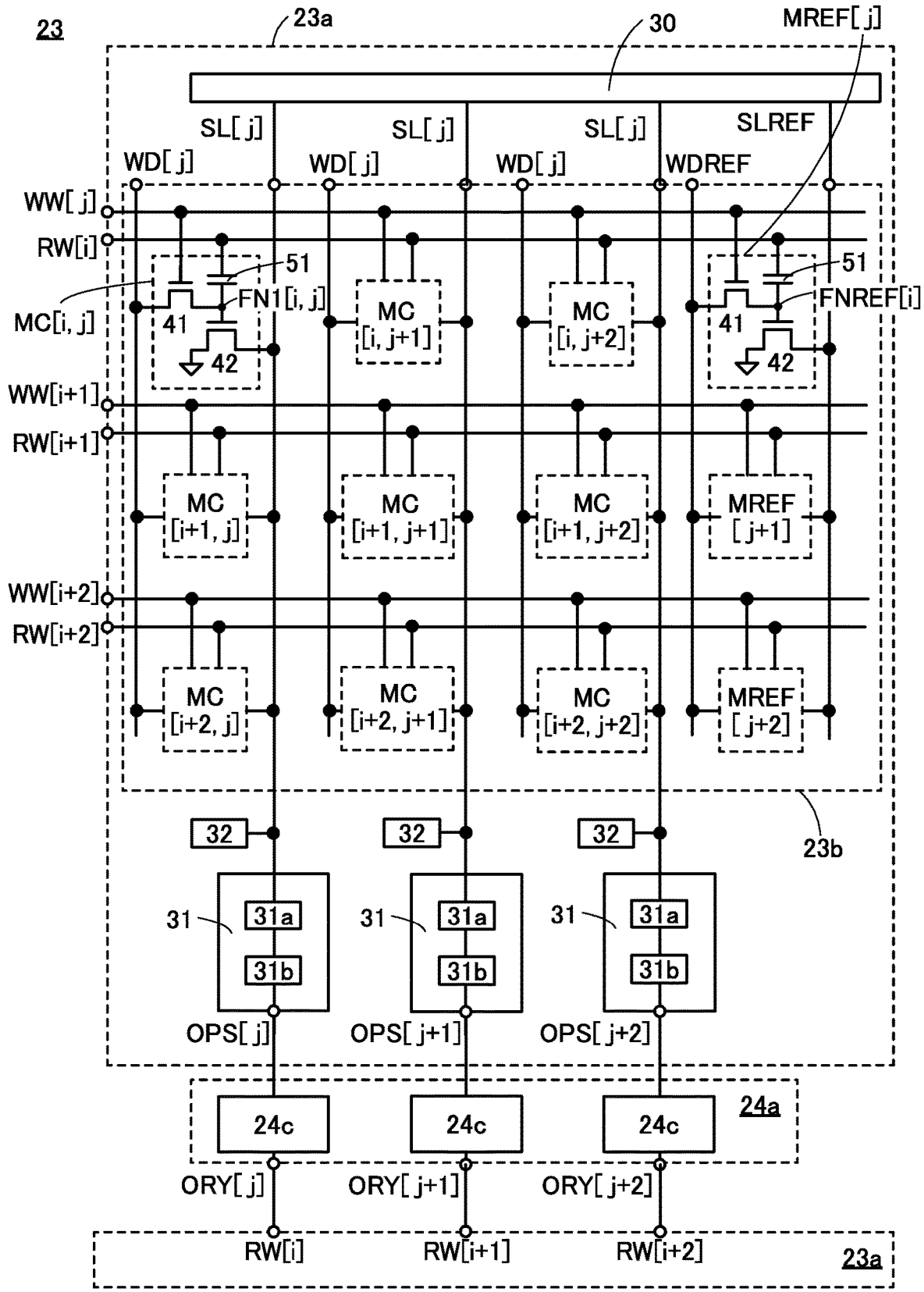
FIG. 10 A block diagram illustrating a semiconductor device.

In FIG. 10, an example in which the neuron 23 has a function of canceling an offset is described. The neuron 23 includes the synapse circuit 23a and the activation function circuit 24a. The synapse circuit 23a includes the memory unit 23b, the current source circuit 30, the column output circuit 31, an offset current circuit 32, the signal line WD[j], the signal line WW[i], the signal line SL[j], the signal line RW[i], and the wiring COM. The column output circuit 31 includes the current-voltage conversion circuit 31a, the offset circuit 31b, and the first output terminal. Note that j indicates the number of neurons and is an integer greater than or equal to 1. Note that i indicates a memory cell in which the weight coefficient of the synapse circuit 23a is held and is an integer greater than or equal to 1.

The memory unit 23b includes a plurality of memory cells MC. The memory cell MC includes the transistor 41, the transistor 42, and the capacitor 51. The configuration of the memory cell MC is already described with reference to FIG. 3; thus, description thereof is omitted here. In FIG. 10, description is made using the memory cell MC[i,j] to the memory cell MC[i+2,j] as an example for simplicity.

The memory cell MC[i,j] to the memory cell MC[i+2,j] are electrically connected to the signal line SL. Further, the current source circuit 30, the current-voltage conversion circuit 31a, the offset circuit 31b, and the offset current circuit 32 are electrically connected to the signal line SL. The current-voltage conversion circuit 31a having a different configuration from that in FIG. 3 and the offset current circuit 32 are described with reference to FIG. 11 and the following drawings.

Figure 11:
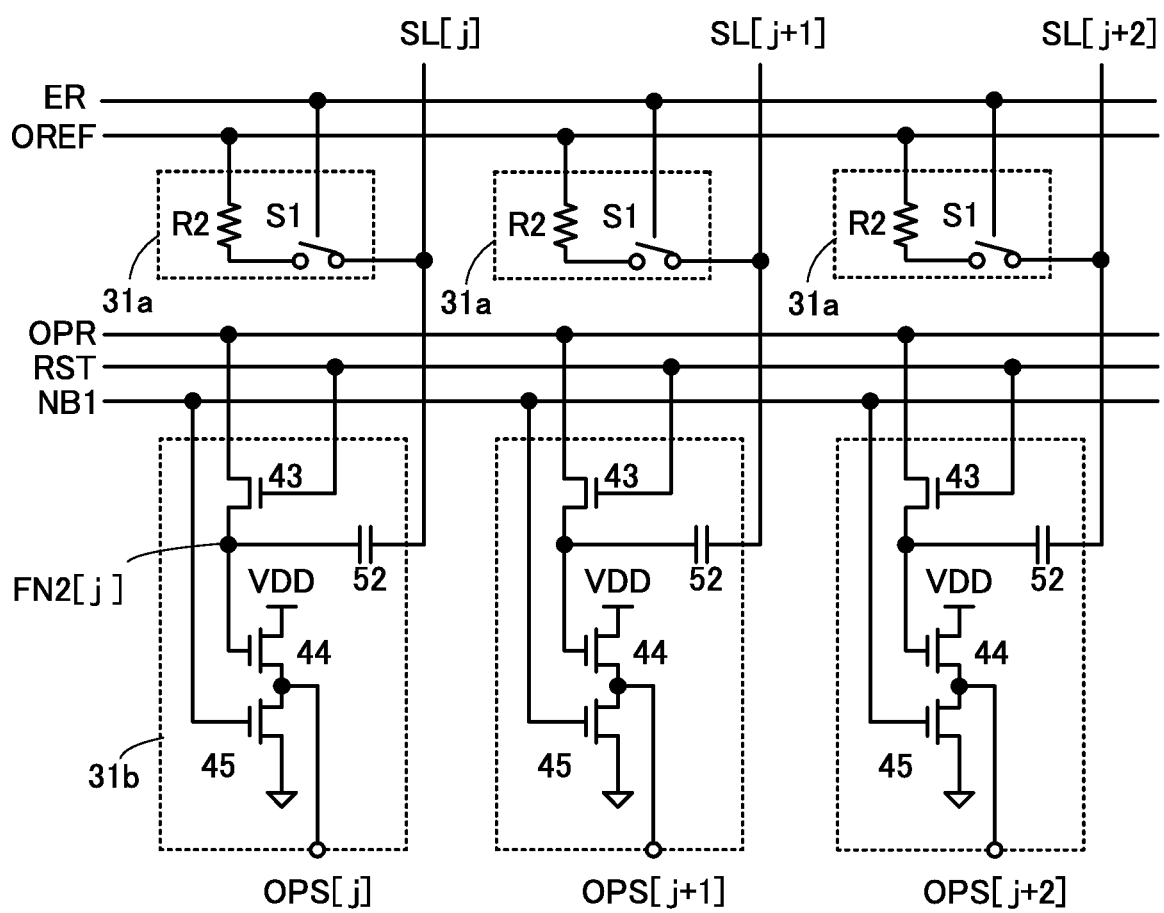
FIG. 11 A circuit diagram illustrating a semiconductor device.

The current-voltage conversion circuit 31a included in the column output circuit 31 is described with reference to FIG. 11. The current-voltage conversion circuit 31a includes a current-voltage conversion element R2 and a switch S1. One electrode of the switch S1 is electrically connected to the signal line SL, the other electrode of the switch S1 is electrically connected to one electrode of the current-voltage conversion element R2, and the other electrode of the current-voltage conversion element R2 is electrically connected to the wiring OREF. The switch S1 is controlled by a signal line ER. The current-voltage conversion element R2 is preferably a resistive element but not limited thereto. A diode, a capacitor, or the like may be used. The switch S1 preferably uses a transistor, but is not limited thereto. A diode or the like may be used. Note that when a diode is used, control by the signal line ER is not required.

When the switch S1 is turned off, a period at that time can be used as a period in which the offset current of the signal line SL is canceled by the offset current circuit 32. In addition, when the switch S is turned on, the current-voltage conversion circuit 31a can convert current supplied to the signal line SL into a potential by the current-voltage conversion element R2. Thus, the switch S1 can control a period during which the current is supplied, and power consumption can be reduced.

The offset circuit 31b is already described with reference to FIG. 5; thus, description thereof is omitted here.

The offset current circuit 32 is described with reference to FIG. 12. The offset current circuit 32 includes a current sink circuit 32a, a current supply circuit 32b, a signal line ORM, a signal line OSM, a signal line ORP, a signal line OSP, a wiring COM, and a wiring VDD. The current sink circuit 32a includes a transistor 61, a transistor 62, a transistor 63, and a capacitor 64, and the current supply circuit 32b includes a transistor 65, a transistor 66, a transistor 67, and a capacitor 68.

Description is made focusing on the signal line SL[j]. Although not illustrated in FIG. 12, the current sink circuit 32a[j] and the current supply circuit 32b[j] are each electrically connected to the current source circuit 30, the current-voltage conversion circuit 31a[j], the offset circuit 31b[j], and the memory cell MC[i,j] to the memory cell MC[i+2,j] through the signal line SL[j].

The signal line SL[j] is electrically connected to one of a source and a drain of the transistor 61 and one of a source and a drain of the transistor 65.

The one of the source and the drain of the transistor 61 is further electrically connected to one of a source and a drain of the transistor 62; a gate of the transistor 61 is electrically connected to one electrode of the capacitor 64, the other of the source and the drain of the transistor 62, and one of a source and a drain of the transistor 63; the other of the source and the drain of the transistor 63 is electrically connected to the wiring COM, the other of the source and the drain of the transistor 61, and the other electrode of the capacitor 64; a gate of the transistor 62 is electrically connected to the wiring OSP; and a gate of the transistor 63 is electrically connected to the wiring ORP.

The one of the source and the drain of the transistor 65 is further electrically connected to one of a source and a drain of the transistor 66; a gate of the transistor 65 is electrically connected to one electrode of the capacitor 68, the other of the source and the drain of the transistor 66, and one of a source and a drain of the transistor 67; the other of the source and the drain of the transistor 67 is electrically connected to the wiring VDD, the other of the source and the drain of the transistor 65, and the other electrode of the capacitor 68; a gate of the transistor 66 is electrically connected to the wiring OSM; and a gate of the transistor 67 is electrically connected to the wiring ORM.

Each signal line RW is supplied with an initial potential and further the respective nodes FN1 of the memory cell MC[i,j] to the memory cell MC[i+2,j] are supplied with different weight coefficients as weight potentials. Thus, current flows through the transistor 42 in accordance with the level of the weight potential supplied to the node FN1. When the signal line RW is at an initial potential, a current that the transistor 42 supplies in accordance with the level of the weight potential can be an offset current. Note that the offset current refers to total current flowing through the transistor 42 in each of the memory cell MC[i,j] to the memory cell MC[i+2,j].

The synapse circuit 23a multiplies each input signal by a weight coefficient and add multiplication results to determine the amount of change. Thus, an offset component generated when weight coefficients are set is preferably canceled.

Next, a method for canceling the offset component is described. First, the signal line SL[j] is supplied with a reference current from the current mirror circuit included in the current source circuit 30. When a weight coefficient is not supplied and the transistor 42 of each of the memory cells MC does not supply the offset current, a reference potential is generated to the signal line SL[j] by the current-voltage conversion circuit 31$a$[j]. However, when a weight coefficient is supplied to each of the memory cells MC, the offset current flows through the transistor 42, and the amount of current flowing through the signal line SL[j] is changed. Therefore, the amount of the voltage generated by the current-voltage conversion circuit 31$a$[j] is changed.

Thus, after the weight coefficient is set in each of the memory cells MC, the synapse circuit 23$a$ preferably cancels the offset current generated by the weight coefficients. The weight coefficient can be a positive weight coefficient or a negative weight coefficient. Thus, in order to maintain the reference current regardless of the weight coefficient, it is preferable that the current sink circuit 32$a$[j] be capable of sinking current for canceling the offset current or that the current supply circuit 32$b$[j] be capable of supplying current for canceling the offset current.

First, a method in which the current sink circuit 32$a$[j] sinks current to cancel the offset current is described. The transistor 63 is turned on when the signal line ORP is supplied with a digital signal "H". Thus, the one electrode of the capacitor is initialized with the potential of the wiring COM through the transistor 63.

Subsequently, after the transistor 63 is turned off by the signal line ORP, the transistor 62 is turned on when the signal line OSP is supplied with a signal of a digital signal "H". Thus, the offset current flowing through the signal line SL[j] is supplied to the capacitor 64, and the transistor 61 and the capacitor 64 form a source follower circuit. When the current that the transistor 61 supplies and the offset current are balanced, the potential of the capacitor 64 is stabilized. The transistor 61 is preferably an n-channel transistor. Then, the transistor 62 is turned off and an offset cancellation potential corresponding to the offset current can be held in the capacitor 64.

Next, a method in which the current supply circuit 32$b$[j] supplies current to cancel the offset current is described. The transistor 67 is turned on when the signal line ORM is supplied with a digital signal "H". Thus, the one electrode of the capacitor is initialized with the potential of the wiring VDD through the transistor 67.

Subsequently, after the transistor 67 is turned off by the signal line ORM, the transistor 66 is turned on when the signal line OSM is supplied with a signal of a digital signal "H". Thus, the offset current flowing through the signal line SL[j] is supplied to the capacitor 68, and the transistor 65 and the capacitor 68 form a source follower circuit. When the current that the transistor 65 supplies and the offset current are balanced, the potential of the capacitor 68 is stabilized. The transistor 65 is preferably a p-channel transistor. Then, the transistor 62 is turned off and an offset cancellation potential corresponding to the offset current can be held in the capacitor 68.

It is preferable that the current sink circuit 32$a$[j] and the current supply circuit 32$b$[j] each perform a cancellation operation of the offset current at different timings.

During a period of the cancellation operation of the offset current, the switch S of the current-voltage conversion circuit 31$a$[j] is preferably off. The influence of a conversion error due to the current-voltage conversion element R2 can be reduced when the offset current is not supplied through the current-voltage conversion element R2.

Alternatively, during a period of the cancellation operation of the offset current, the switch S1 of the current-voltage conversion circuit 31$a$[j] may be on. An offset correction including the influence of the current-voltage conversion element R2 can be performed when the offset current is also supplied through the current-voltage conversion element R2.

Furthermore, power consumed by the current-voltage conversion element R2 can be reduced when the switch S1 is turned off in a period during which the product-sum operation processing is stopped.

Figure 12:
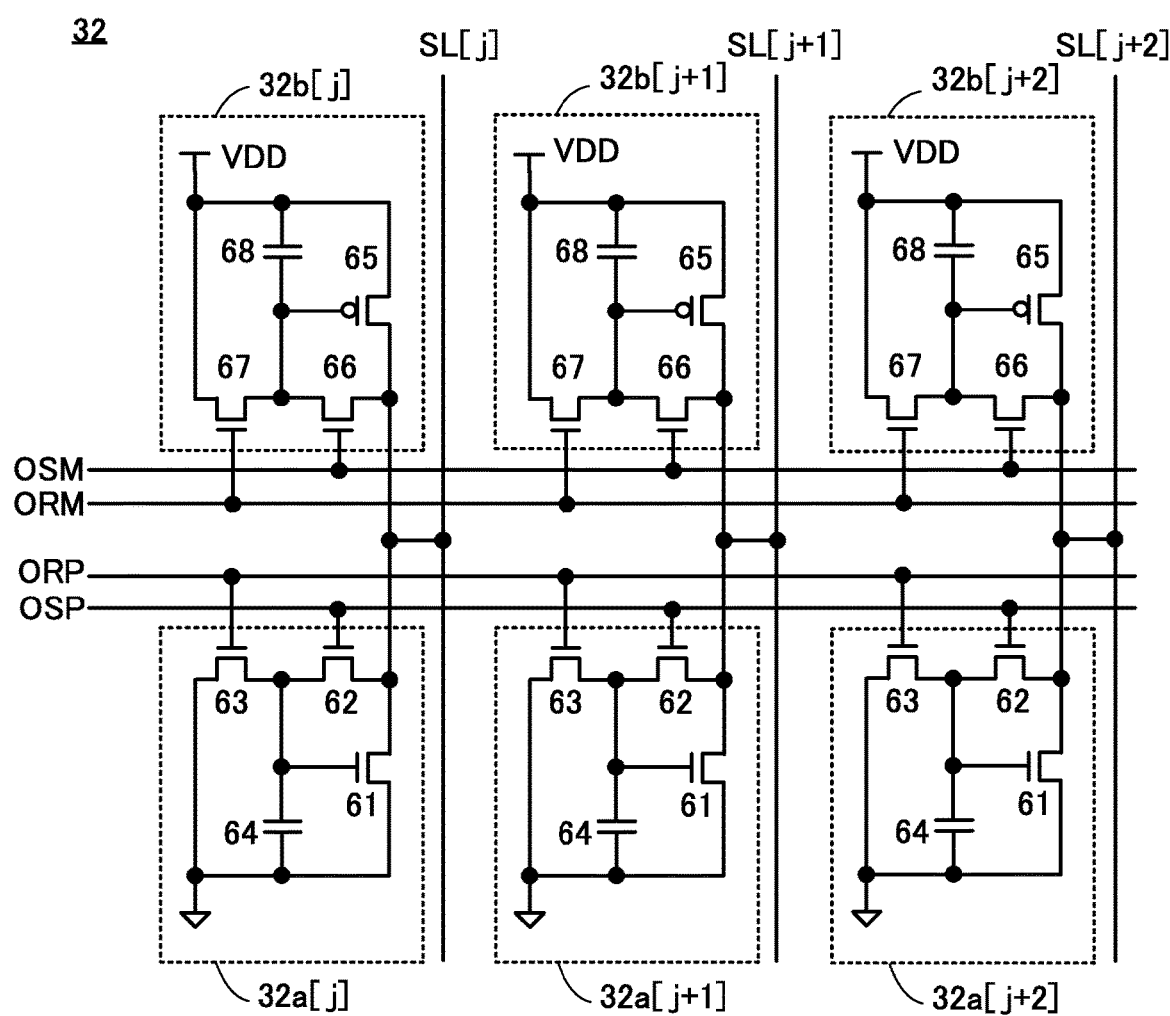
FIG. 12 A circuit diagram illustrating a semiconductor device.
Figure 13:
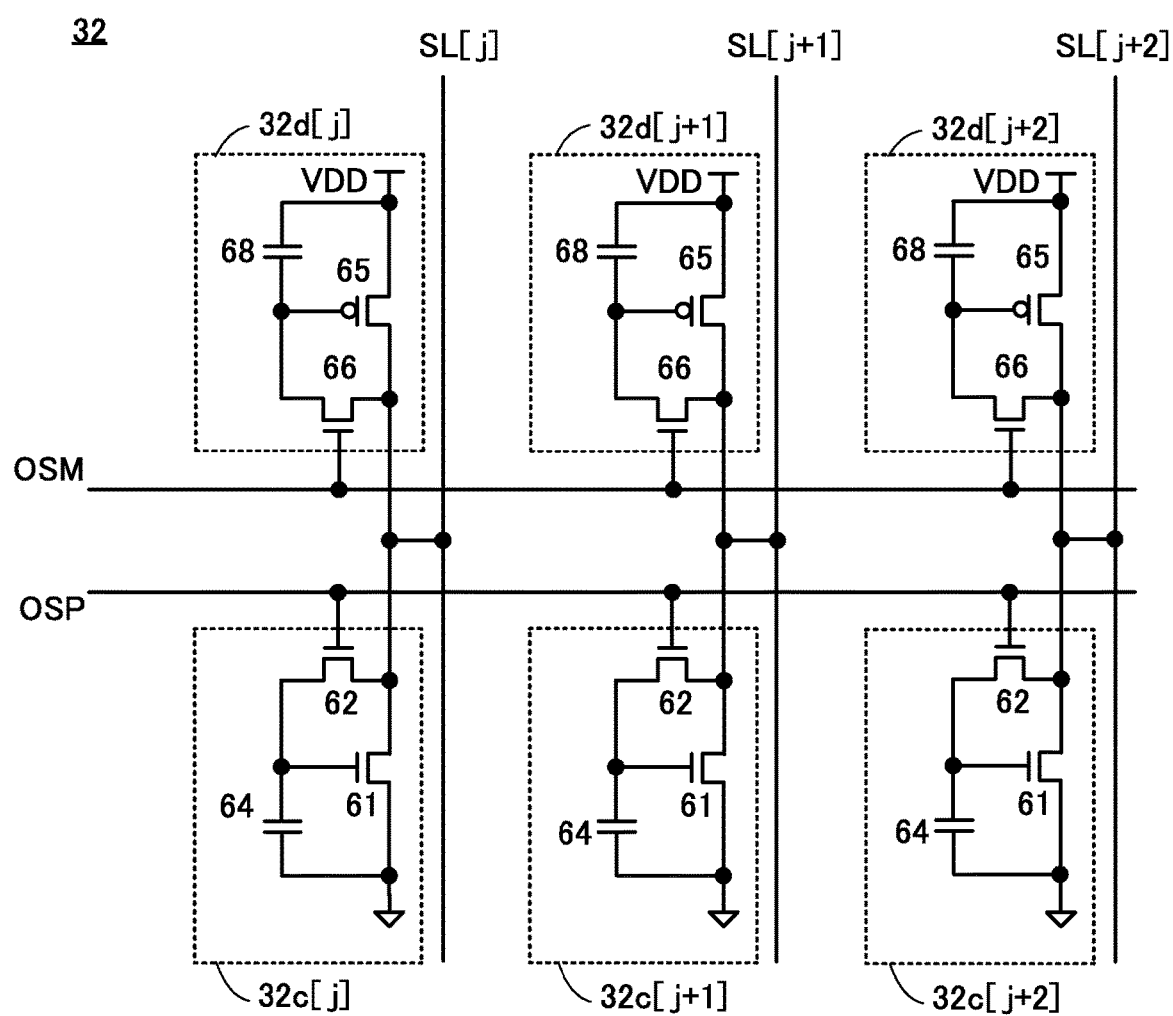
FIG. 13 A circuit diagram illustrating a semiconductor device.

The offset current circuit 32 different from that in FIG. 12 is described with reference to FIG. 13. Unlike the current sink circuit 32$a$[j], a current sink circuit 32$c$[j] does not include the transistor 63 and the signal line ORP. Thus, the capacitor 64 is not initialized with the potential supplied from the wiring COM. In addition, unlike the current supply circuit 32$b$[j], a current supply circuit 32$d$[j] does not include the transistor 67 and the signal line ORM. Thus, the capacitor 68 is not initialized with the potential supplied from the wiring VDD.

Accordingly, the offset current circuit 32 can reduce the number of signal lines and further can reduce the number of transistors to be used; thus, the mount area can be made small. Furthermore, time for initialization can be reduced, leading to improvement in processing speed.

Figure 14:
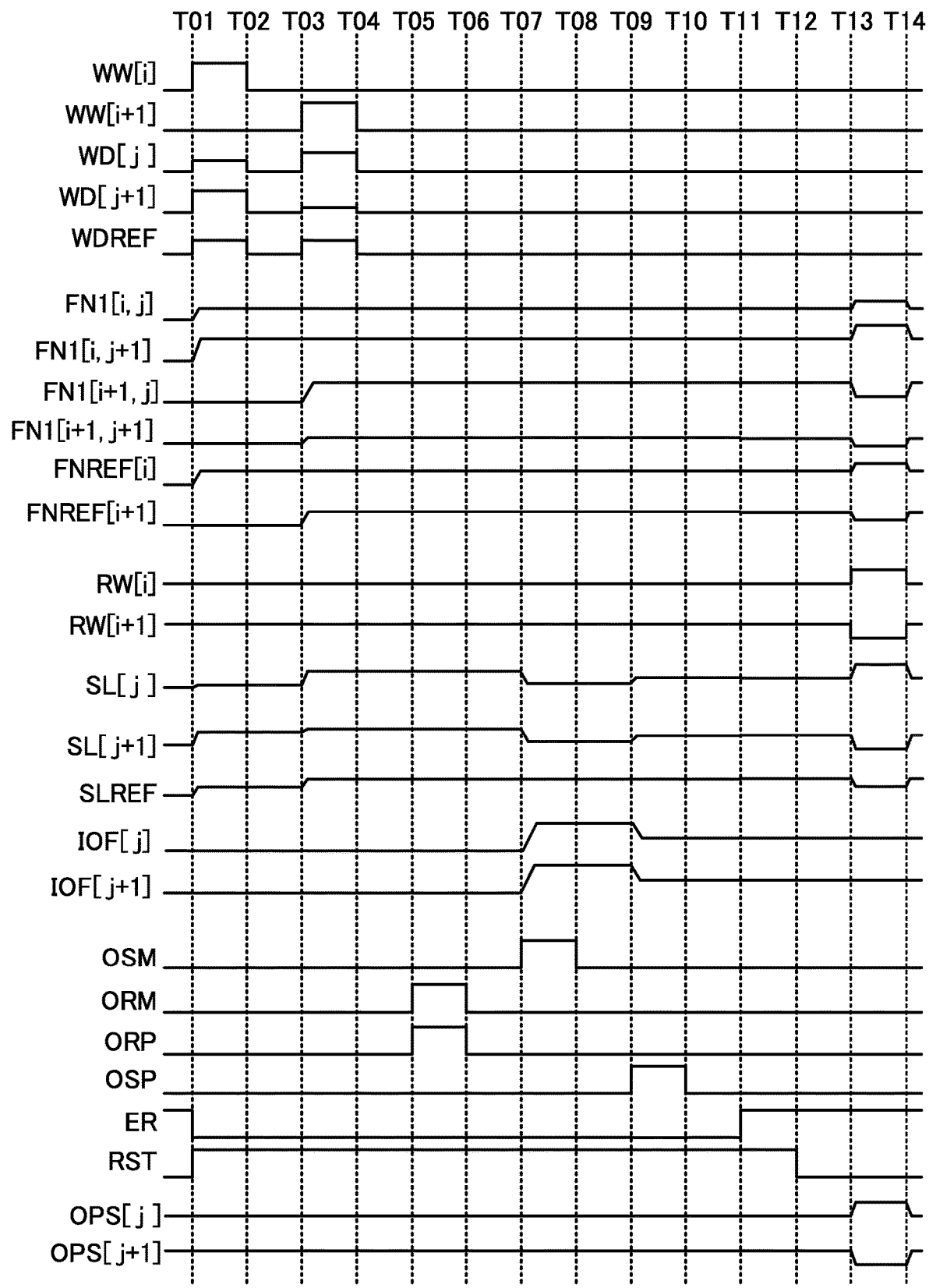
FIG. 14 A timing chart for driving a semiconductor device.

FIG. 14 is a timing chart showing an operation example of the neuron 23 included in the semiconductor device 10. In the timing chart shown in FIG. 14, the operation using the offset current circuit 32 in FIG. 12 is described. In FIG. 14, operations of the memory cell MC[i,j] to the memory cell MC[i+1,j+1], the memory cell MREF[i], and the memory cell MREF[i+1] are described for simplicity.

A period from time T01 to time T04 is a step of storing an analog signal in the memory cells MC.

A period from time T05 to time T10 is a step of setting an offset cancellation potential to the offset current circuit 32.

Further, a period from time T11 to time T12 is a step of setting a reset potential to the offset circuit 31$b$ of the column output circuit 31.

A period from time T13 to time T14 is a step of executing the processing of the product-sum operation and the activation function in each hierarchy of the multilayer perceptrons and obtaining an output of the multilayer neural network.

A period from the time T01 to time T02 is described. The signal line WDREF is supplied with a potential of the analog signal WST. The signal line WD[j] is supplied with a potential of the analog signal WST-VWX[i,j]. The signal line WD[j+1] is supplied with a potential of the analog signal WST-VWX[i,j+1]. The signal line RW[i] and the signal line RW[i+1] are each supplied with an analog signal VXST as a reference potential. Thus, the analog signal VWX[i,j] and the analog signal VWX[i,j+1] supplied to the memory cell MC[i,j] and the memory cell MC[i,j+1], respectively, indicate a different weight coefficient.

The signal line WW[i] is supplied with a digital signal "H", and the signal line WW[i+1] is supplied with a digital signal "L". In addition, the signal line ER is supplied with a digital signal "L", and the signal line RST[i] is supplied with a digital signal "H".

Thus, the potential of the analog signal WST is held in the node FNREF[i]. The potential of the analog signal WST-VWX[i,j] is held in the node FN1[i,j]. The potential of the analog signal WST-VWX[i,j+1] is held in the node FN1[i,j+1].

An offset current corresponding to the potential of the analog signal WST-VWX[i,j] supplied to the node FN1[i,j] flows through the transistor 42 included in the memory cell MC[i,j]. In addition, an offset current flows through the transistor 42 included in the memory cell MC[i,j+1] by the potential of the analog signal WST-VWX[i,j+1] supplied to the node FN1[*i,j*+1].

A period from time T03 to the time T04 is described. The signal line WW[i] is supplied with a digital signal "L". The signal line WW[i+1] is supplied with a digital signal "H". The signal line WD[j] is supplied with the analog signal WST-VWX[i+1,j]. The signal line WD[j+1] is supplied with the analog signal WST-VWX[i+1,j+1]. The signal line WDREF is supplied with the analog signal WST. Thus, the analog signal VWX[i+1,j] and the analog signal VWX[i+1,j+1] supplied to the memory cell MC[i+1,j] and the memory cell MC[i+1,j+1], respectively, indicate a different weight coefficient.

Thus, the potential of the analog signal WST is held in the node FNREF[i+1]. The potential of the analog signal WST-VWX[i+1,j] is held in the node FN1[*i*+1,j]. The potential of the analog signal WST-VWX[i+1,j+1] is held in the node FN1[*i*+1,j+1].

Accordingly, the sum of currents flowing through the transistor 42 included in each of the memory cell MC[i,j] and the memory cell MC[i+1,j] flows as an offset current through the signal line SL[j]. In addition, the sum of currents flowing through the transistor 42 included in each of the memory cell MC[i,j+1] and the memory cell MC[i+1,j+1] flows as an offset current through the signal line SL[j+1].

A period from the time T05 to time T06 is described. Here, description is made focusing on the offset current circuit 32[*j*] electrically connected to the signal line SL[j] for simplicity.

When the signal line ORP is supplied with a digital signal "H", the current sink circuit 32a[*j*] is initialized with the potential supplied to the wiring COM. In addition, when the signal line ORM is supplied with a digital signal "H", the current supply circuit 32b[*j*] is initialized with the potential supplied to the wiring VDD.

A period from time T07 to time T08 is described. First, the offset component is canceled by the current supply circuit 32b[*j*]. The offset current generated by the weight coefficients flows through the signal line SL[j]. A current for canceling the offset current is supplied so that the reference current is supplied from the current mirror circuit included in the current source circuit 30.

A period from time T09 to time T10 is described. Subsequently, the offset component is canceled by the current sink circuit 32a[*j*]. The offset current generated by the weight coefficients flows through the signal line SL[j]. A current for canceling the offset current is sank so that the reference current is supplied from the current mirror circuit included in the current source circuit 30.

The period from the time T1 to the time T12 is described. The switch S1 is turned on when the signal line ER is supplied with a digital signal "H". A current at which the offset current generated by the weight coefficients is canceled is output to the signal line SL[j]. The current-voltage conversion element R2 converts the current flowing through the signal line SL[j] into an initialization potential. At this time, the node FN2 is supplied with the reset potential VPR through the wiring OPR by the signal RST. Thus, the initialization potential using the reset potential VPR supplied to the node FN2[*j*] as a reference can be held in the capacitor 52 included in the offset circuit 31b.

A period from the time T12 to the time T13 is described. The node FN2[*j*] becomes a floating node when the signal line RST is supplied with a digital signal "L". Thus, the node FN2[*j*] can sense a change in the potential of the signal line SL[j].

The period from the time T13 to the time T14 is described. Description is made focusing on the signal line SL[j]. The memory cell MC[i,j] is supplied with an input data potential through the signal line RW[i]. The node FN1[*i,j*] can add the input data potential to the analog signal WST-VWX[i,j] held in the node FN1[*i,j*] through the capacitor 51. Thus, the gate of the transistor 42 is supplied with the potential in which the input data potential is added to the analog signal WST-VWX [i,j]. Accordingly, the transistor 42 can multiply the input data potential and the weight potential using the conductance of the transistor 42 and convert the multiplication result into the first current. Further, the memory cell MC[i+ 1,j] is supplied with an input data potential by the signal line RW[i+1] and the input data potential and the weight potential can be multiplied.

The first currents multiplied in the memory cell MC[i,j] and the memory cell MC[i+1,j] are output to the signal line SL[j], and the second current is generated by adding each of the first currents. The second current is converted into the first potential by the current-voltage conversion element R2 and supplied to the node FN2[*j*] through the capacitor 52 of the offset circuit 31b. The addition result detected by the node FN2[*j*] is output to the output terminal OPS as the fourth potential by the source follower circuit included in the offset circuit 31b.

The offset current circuit 32 can prevent the product-sum operation result from being out of the detection range by the weight potentials in such a manner that the operation result cancels the offset current generated by the weight potentials. Furthermore, the neuron 23 can suppress power consumption in a period that does not contribute to arithmetic operation by being equipped with the switch S1.

The structure and method described above in this embodiment can be implemented in combination as appropriate with the structures and methods described in the other embodiments.

Embodiment 3

In this embodiment, a cross-sectional structure of a semiconductor device will be described. In this embodiment, a cross-sectional structure of the semiconductor device corresponding to the memory cell illustrated in FIG. 9(B) is described.

Figure 15:
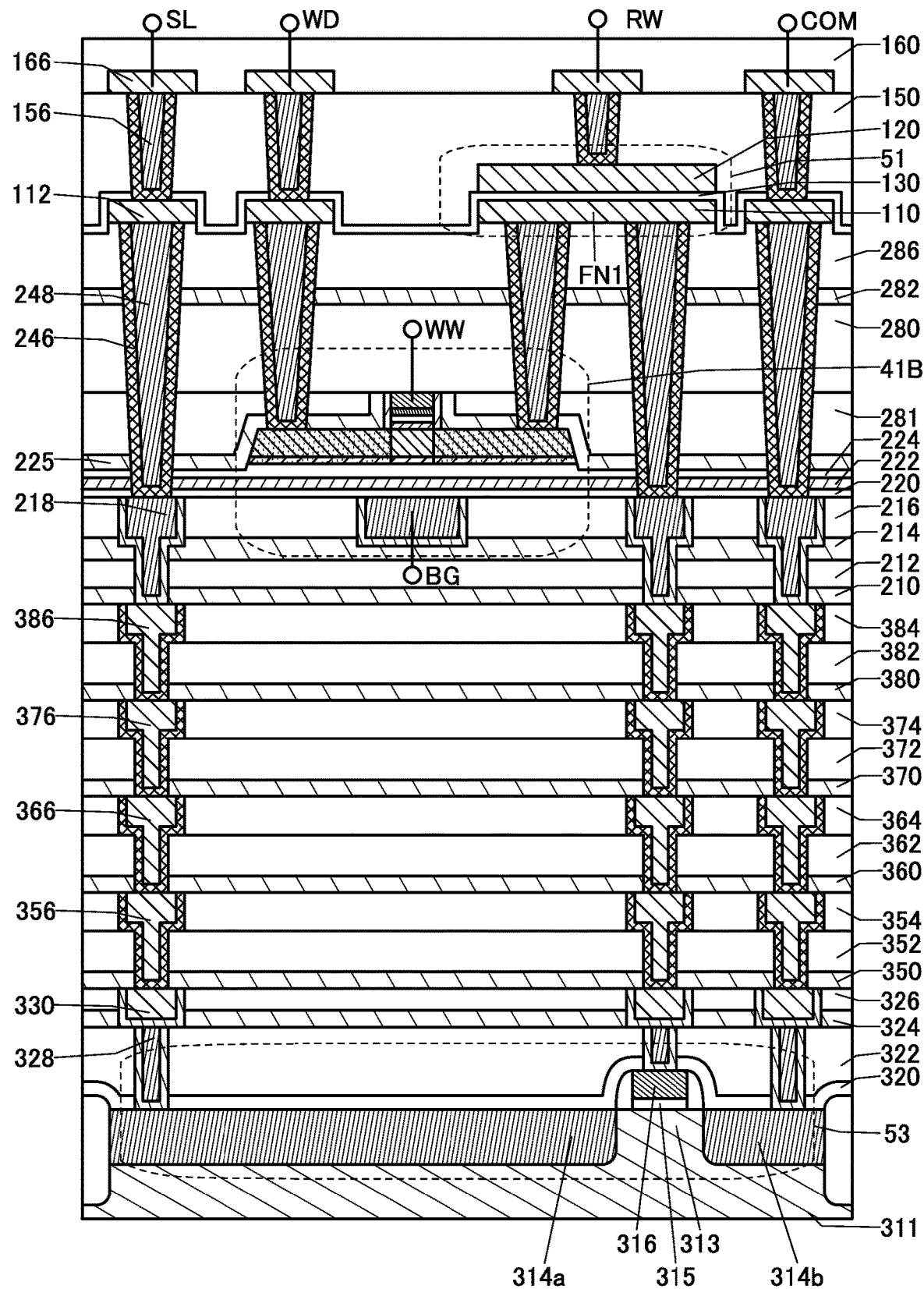
FIG. 15 A cross-sectional view illustrating a semiconductor device.
Figure 17:
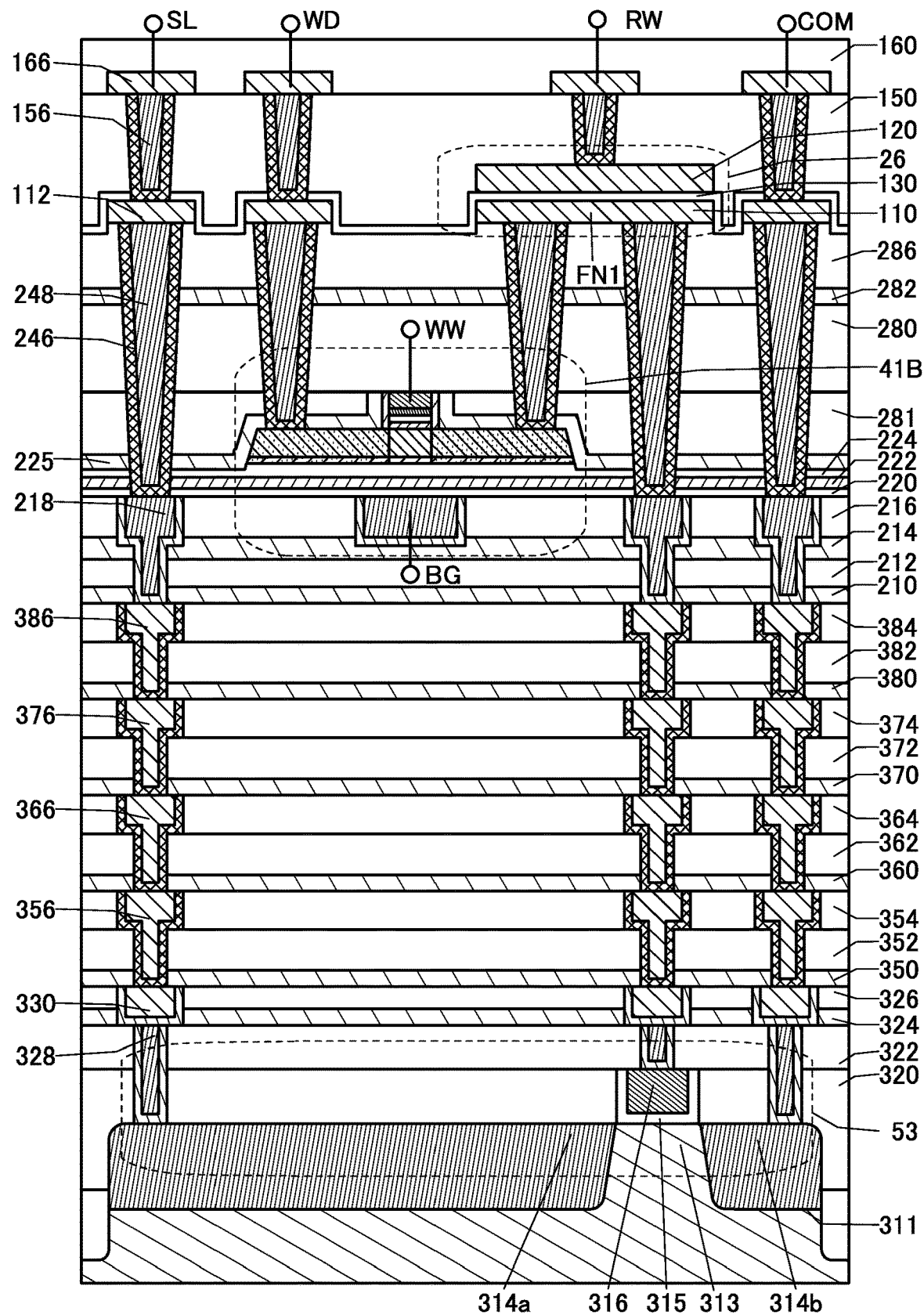
FIG. 17 A cross-sectional view illustrating a semiconductor device.
Figure 18:
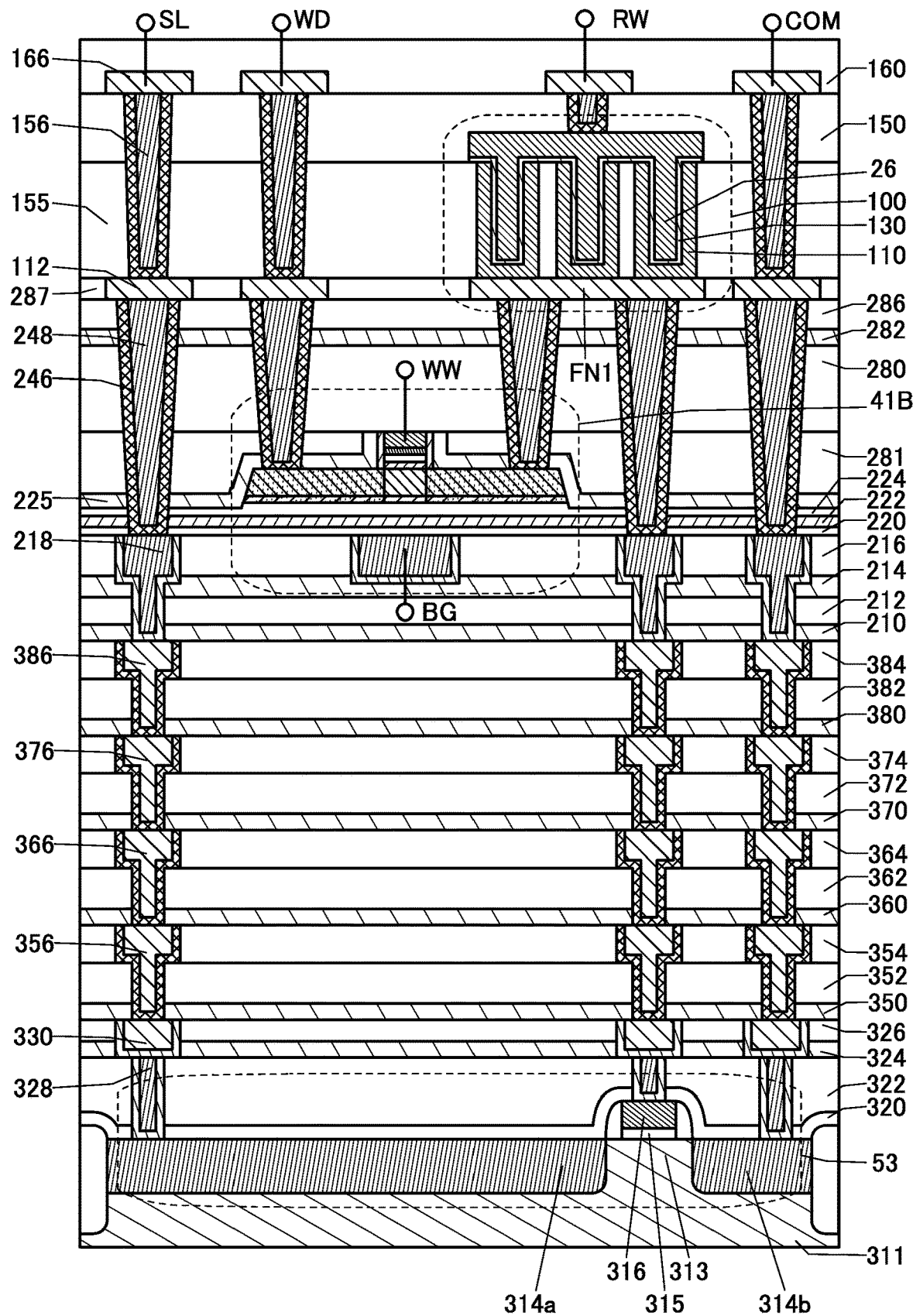
FIG. 18 A cross-sectional view illustrating a semiconductor device.

The memory cell MCB described with reference to FIG. 9(B) includes the transistor 53, the transistor 41B, and the capacitor 51 as illustrated in FIG. 15, FIG. 17, and FIG. 18.
[Cross-Sectional Structure 1]

The semiconductor device illustrated in FIG. 15 includes the transistor 53, the transistor 41B, and the capacitor 51. The transistor 41B is provided above the transistor 53, and the capacitor 51 is provided above the transistor 53 and the transistor 41B.

The transistor 41B is a transistor in which a channel is formed in a semiconductor layer including an oxide semiconductor (an OS transistor). Although the transistor 41B will be described later, with the OS transistor having the structure illustrated in FIG. 15, the transistor 41B can be formed with a high yield even when miniaturized. The semiconductor device including such an OS transistor can be miniaturized or highly integrated. Since the off-state current of the OS transistor is low, a semiconductor device using it can hold stored contents for a long time. In other words, since refresh operation is not required or frequency of refresh operation is extremely low, the power consumption of the semiconductor device can be sufficiently reduced. Furthermore, the transistor 43 included in the reset circuit is preferably an OS transistor. Since the off-state current of the transistor 43 is small, the node FN2 can suppress a variation in the first potential held in the node FN2.

In FIG. 15 and FIG. 16, the signal line SL is electrically connected to one of a source and a drain of the transistor 53, and the wiring COM is electrically connected to the other of the source and the drain of the transistor 53. The signal line WD is electrically connected to one of a source and a drain of the transistor 41B, and the signal line WW is electrically connected to a first gate of the transistor 41B, and the wiring BG is electrically connected to a second gate of the transistor 41B. A gate of the transistor 53 and the other of the source and the drain of the transistor 41B are electrically connected to the one electrode of the capacitor 51, and a signal line RW is electrically connected to the other electrode of the capacitor 51.

The transistor 53 is provided over a substrate 311 and includes a conductor 316, an insulator 315, a semiconductor region 313 that is part of the substrate 311, and a low-resistance region 314a and a low-resistance region 314b each functioning as a source region or a drain region.

The transistor 53 is of either a p-channel type or an n-channel type.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 53 may be an HEMT (High Electron Mobility Transistor) using GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that a work function of a conductor is determined by a material thereof, whereby the threshold voltage can be adjusted. Specifically, it is preferable to use a material such as titanium nitride, tantalum nitride, or the like for the conductor. Furthermore, in order to ensure both conductivity and embeddability, it is preferable to use a stacked layer of metal materials such as tungsten and aluminum for the conductor, and it is particularly preferable to use tungsten in terms of heat resistance.

Note that the transistor 53 illustrated in FIG. 15 is just an example and the structure is not limited thereto; an appropriate transistor can be used in accordance with a circuit configuration or a driving method.

An insulator 320, an insulator 322, an insulator 324, and an insulator 326 are provided to be stacked in this order to cover the transistor 53.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

The insulator 322 has a function of a planarization film for planarizing a level difference caused by the transistor 53 or the like provided below the insulator 322. For example, the top surface of the insulator 322 may be planarized by planarization treatment using a chemical mechanical polishing (CMP) method or the like to improve planarity.

It is preferable to use, for the insulator 324, a film having a barrier property that prevents diffusion of hydrogen and impurities from the substrate 311, the transistor 53, or the like into a region where the transistor 41B is provided.

As an example of the film having a barrier property against hydrogen, silicon nitride formed by a CVD method can be used. Here, the diffusion of hydrogen into a semiconductor element including an oxide semiconductor, such as the transistor 41B, degrades the characteristics of the semiconductor element in some cases. Therefore, a film that inhibits diffusion of hydrogen is preferably used between the transistor 41B and the transistor 53. Specifically, the film that inhibits diffusion of hydrogen is a film from which a small amount of hydrogen is released.

The amount of released hydrogen can be analyzed by thermal desorption spectroscopy (TDS), for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in the TDS analysis in the range of 50° C. to 500° C., for example.

Note that the permittivity of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. When a material with a low permittivity is used for an interlayer film, the parasitic capacitance between wirings can be reduced.

Moreover, a conductor 328, a conductor 330, and the like that are electrically connected to the capacitor 51 or the transistor 41B are embedded in the insulator 320, the insulator 322, the insulator 324, and the insulator 326. Note that the conductor 328 and the conductor 330 each have a function of a plug or a wiring. In addition, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 15, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328 and the conductor 330.

Note that for example, as the insulator 350, an insulator having a barrier property against hydrogen is preferably used, like the insulator 324. Furthermore, the conductor 356 preferably includes a conductor having a barrier property against hydrogen. The conductor having a barrier property against hydrogen is formed particularly in an opening included in the insulator 350 having a barrier property against hydrogen. In such a structure, the transistor 53 and the transistor 41B can be separated by a barrier layer, so that diffusion of hydrogen from the transistor 53 into the transistor 41B can be inhibited.

Note that as the conductor having a barrier property against hydrogen, tantalum nitride is preferably used, for example. In addition, by stacking tantalum nitride and tungsten, which has high conductivity, the diffusion of hydrogen from the transistor 53 can be inhibited while the conductivity as a wiring is kept. In that case, it is preferable to have a structure in which a tantalum nitride layer having a barrier property against hydrogen is in contact with the insulator 350 having a barrier property against hydrogen.

A wiring layer may be provided over the insulator 354 and the conductor 356. For example, in FIG. 15, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, an insulator having a barrier property against hydrogen is preferably used, like the insulator 324. Furthermore, the conductor 366 preferably includes a conductor having a barrier property against hydrogen. The conductor having a barrier property against hydrogen is formed particularly in an opening included in the insulator 360 having a barrier property against hydrogen. In such a structure, the transistor 53 and the transistor 41B can be separated by a barrier layer, so that the diffusion of hydrogen from the transistor 53 into the transistor 41B can be inhibited.

A wiring layer may be provided over the insulator 364 and the conductor 366. For example, in FIG. 15, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, an insulator having a barrier property against hydrogen is preferably used, like the insulator 324. Furthermore, the conductor 376 preferably includes a conductor having a barrier property against hydrogen. The conductor having a barrier property against hydrogen is formed particularly in an opening included in the insulator 370 having a barrier property against hydrogen. In such a structure, the transistor 53 and the transistor 41B can be separated by a barrier layer, so that the diffusion of hydrogen from the transistor 53 into the transistor 41B can be inhibited.

A wiring layer may be provided over the insulator 374 and the conductor 376. For example, in FIG. 15, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, an insulator having a barrier property against hydrogen is preferably used, like the insulator 324. Furthermore, the conductor 386 preferably includes a conductor having a barrier property against hydrogen. The conductor having a barrier property against hydrogen is formed particularly in an opening included in the insulator 380 having a barrier property against hydrogen. In such a structure, the transistor 53 and the transistor 41B can be separated by a barrier layer, so that the diffusion of hydrogen from the transistor 53 into the transistor 41B can be inhibited.

An insulator 210, an insulator 212, an insulator 214, and an insulator 216 are provided to be stacked over the insulator 384 in this order. A material having a barrier property against oxygen and hydrogen is preferably used for any of the insulator 210, the insulator 212, the insulator 214, and the insulator 216.

As the insulator 210 and the insulator 214, for example, it is preferably to use a film having a barrier property that inhibits diffusion of hydrogen and impurities from the substrate 311, a region where the transistor 53 is provided, or the like into a region where the transistor 41B is provided. Therefore, a material similar to that for the insulator 324 can be used.

As an example of the film having a barrier property against hydrogen, silicon nitride formed by a CVD method can be used. Here, the diffusion of hydrogen into a semiconductor element including an oxide semiconductor, such as the transistor 41B, degrades the characteristics of the semiconductor element in some cases. Therefore, a film that inhibits diffusion of hydrogen is preferably used between the transistor 41B and the transistor 53. Specifically, the film that inhibits diffusion of hydrogen is a film from which a small amount of hydrogen is released.

As the film having a barrier property against hydrogen, for example, a metal oxide such as aluminum oxide, hafnium oxide, or tantalum oxide is preferably used for each of the insulator 210 and the insulator 214.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 41B in a manufacturing process and after manufacturing of the transistor. In addition, release of oxygen from the oxide included in the transistor 41B can be inhibited. Therefore, aluminum oxide is suitably used as a protective film for the transistor 41B.

For example, for the insulator 212 and the insulator 216, a material similar to that for the insulator 320 can be used. Furthermore, when a material with a relatively low permittivity is used for an interlayer film, the parasitic capacitance between wirings can be reduced. For example, a silicon oxide film, a silicon oxynitride film, or the like can be used as the insulator 212 and the insulator 216.

Moreover, a conductor 218 and a conductor (a conductor 205) and the like included in the transistor 41B are embedded in the insulator 210, the insulator 212, the insulator 214, and the insulator 216. Note that the conductor 218 has a function of a plug or a wiring that is electrically connected to the capacitor 51 or the transistor 53. The conductor 218 can be provided using a material similar to those for the conductor 328 and the conductor 330.

In particular, the conductor 218 in a region in contact with the insulator 210 and the insulator 214 is preferably a conductor having a barrier property against oxygen, hydrogen, and water. In such a structure, the transistor 53 and the transistor 41B can be separated by a layer having a barrier property against oxygen, hydrogen, and water; thus, the diffusion of hydrogen from the transistor 53 into the transistor 41B can be inhibited.

The transistor 41B is provided above the insulator 214. Note that the transistor 41B illustrated in FIG. 15 is just an example and the structure is not limited thereto; an appropriate transistor may be used in accordance with a circuit configuration or a driving method.

An insulator 280 is provided above the transistor 41B. In the insulator 280, an excess-oxygen region is preferably formed. In particular, in the case of using an oxide semiconductor in the transistor 41B, when an insulator including an excess-oxygen region is provided for an interlayer film or the like in the vicinity of the transistor 41B, oxygen vacancies in an oxide 230 included in the transistor 41B are reduced, whereby the reliability can be improved. The insulator 280 that covers the transistor 41B may function as a planarization film that covers an uneven shape thereunder. Note that the insulator 280 is provided in contact with an insulator 281 and an insulator 225 that are formed over the transistor 41B.

As the insulator including an excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

An insulator 282 is provided over the insulator 280. A material having a barrier property against oxygen and hydrogen is preferably used for the insulator 282. Thus, a material similar to that for the insulator 214 can be used for the insulator 282. For the insulator 282, a metal oxide such as aluminum oxide, hafnium oxide, or tantalum oxide is preferably used, for example.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 41B in a manufacturing process and after manufacturing of the transistor. In addition, release of oxygen from the oxide included in the transistor 41B can be inhibited. Therefore, aluminum oxide is suitably used as a protective film for the transistor 41B.

An insulator 286 is provided over the insulator 282. A material similar to that for the insulator 320 can be used for the insulator 286. When a material with a relatively low permittivity is used for an interlayer film, the parasitic capacitance between wirings can be reduced. For example, a silicon oxide film, a silicon oxynitride film, or the like can be used for the insulator 286.

A conductor 246, a conductor 248, and the like are embedded in an insulator 220, an insulator 222, an insulator 224, the insulator 280, the insulator 282, and an insulator 286.

The conductor 246 and the conductor 248 each have a function of a plug or a wiring that is electrically connected to the capacitor 51, the transistor 41B, or the transistor 53. The conductor 246 and the conductor 248 can be provided using materials similar to those for the conductor 328 and the conductor 330.

The capacitor 51 is provided above the transistor 41B. The capacitor 51 includes a conductor 110, a conductor 120, and an insulator 130.

A conductor 112 may be provided over the conductor 246 and the conductor 248. The conductor 112 has a function of a plug or a wiring that is electrically connected to the capacitor 51, the transistor 41B, or the transistor 53. The conductor 110 has a function of the electrode of the capacitor 51. Note that the conductor 112 and the conductor 110 can be formed at the same time.

As the conductor 112 and the conductor 110, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

Although the conductor 112 and the conductor 110 having a single-layer structure are illustrated in FIG. 15, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

As a dielectric of the capacitor 51, the insulator 130 is provided over the conductor 112 and the conductor 110. The insulator 130 can be provided to have a stacked layer or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 51 with the structure, owing to the insulator 130, the dielectric strength can be increased and the electrostatic breakdown of the capacitor 51 can be inhibited.

Over the insulator 130, the conductor 120 is provided to overlap with the conductor 110. Note that a conductive material such as a metal material, an alloy material, or a metal oxide material can be used for the conductor 120. It is preferable to use a high-melting-point material which has both heat resistance and conductivity, such as tungsten or molybdenum, and it is particularly preferable to use tungsten. Furthermore, in the case where the conductor 120 is formed concurrently with another component such as a conductor, Cu (copper), Al (aluminum), or the like which is a low-resistance metal material is used.

An insulator 150 is provided over the conductor 120 and the insulator 130. The insulator 150 can be provided using a material similar to that for the insulator 320. Furthermore, the insulator 150 may function as a planarization film that covers an uneven shape thereunder.

The above is the description of the structure example. With the use of the structure, a change in electrical characteristics can be reduced and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. Alternatively, a miniaturized or highly integrated semiconductor device can be provided with high productivity.

<Transistor 41B>

An example of the OS transistor that can be used as the above transistor 41B is described.

Figure 16A:
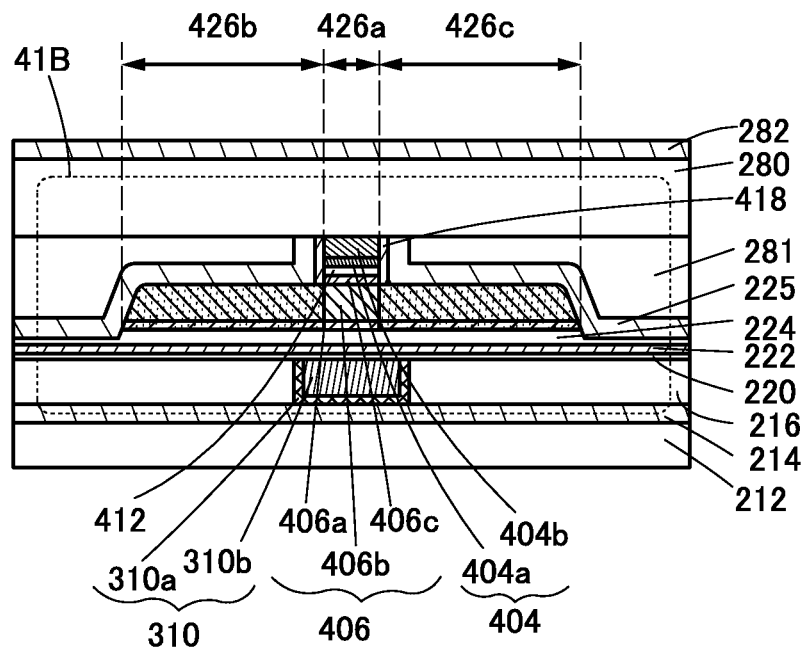
FIG. 16 Cross-sectional views illustrating a semiconductor device.

FIG. 16(A) is a cross-sectional view of the transistor 41B, which is also a cross-sectional view in the channel width direction of the transistor 41B.

As illustrated in FIG. 16(A), the transistor 41B includes the insulator 224 positioned over the insulator 212; an oxide 406a positioned over the insulator 224; an oxide 406b positioned in contact with at least part of the top surface of the oxide 406a; an oxide 406c positioned in contact with at least part of the top surface of the oxide 406a; an insulator 412 positioned over the oxide 406c; a conductor 404a positioned over the insulator 412; a conductor 404b positioned over the conductor 404a; a sidewall insulator 418 positioned in contact with side surfaces of the insulator 412, the conductor 404a, and the conductor 404b; and the insulator 225 that is positioned in contact with top and side surfaces of the oxides 406b and 406c and a side surface of the sidewall insulator 418.

Hereinafter, the oxides 406a, 406b, and 406c are collectively referred to as an oxide 406 in some cases. The conductor 404a and the conductor 404b are collectively referred to as a conductor 404 in some cases. A conductor 310a and a conductor 310b are collectively referred to as a conductor 310 in some cases.

A transistor 41 may have a structure including the insulator 216 positioned over an insulator 401, and the conductor 310 positioned so as to be embedded in the insulator 216.

In the conductor 310, the conductor 310a is formed in contact with an inner wall of an opening in the insulator 216, and further the conductor 310b is formed on the inner side. Here, the top surfaces of the conductor 310a and the conductor 310b can have substantially the same level as the top surface of the insulator 216.

The conductor 404 can function as a top gate and the conductor 310 can function as a back gate. The potential of the back gate may be the same as the potential of the top gate, or may be a ground potential or a given potential. By changing the potential of the back gate independently of that of the top gate, the threshold voltage of the transistor can be changed.

Here, it is preferable to use, for the conductor 310a a conductive material having a function of inhibiting the passage of (a conductive material that is less likely to transmit) impurities such as water or hydrogen (also referred to as a conductive material having a function of inhibiting the passage of impurities such as water or hydrogen). For example, tantalum, tantalum nitride, ruthenium, or ruthenium oxide is preferably used, and a single layer or a stacked layer is used. This can inhibit diffusion of impurities such as hydrogen or water from a layer under the insulator 214 into an upper layer through the conductor 310.

Furthermore, it is preferable to use a conductive material containing tungsten, copper, or aluminum as its main component for the conductor 310b. Moreover, although not illustrated, the conductor 310b may have a stacked-layer structure, and for example, may be a stack of titanium, titanium nitride, and the above-described conductive material.

The insulator 214 can function as a barrier insulating film that prevents impurities such as water or hydrogen from entering the transistor from a lower layer. It is preferable to use, for the insulator 214, an insulating material having a function of inhibiting the passage of impurities such as water or hydrogen, for example, aluminum oxide. This can inhibit diffusion of impurities such as hydrogen or water into a layer over the insulator 214.

Furthermore, it is preferable to use, for the insulator 214, an insulating material having a function of inhibiting the passage of oxygen (e.g., an oxygen atom or an oxygen molecule). This can inhibit downward diffusion of oxygen contained in the insulator 224 or the like.

It is preferable to use, for the insulator 222, an insulating material having a function of inhibiting the passage of impurities such as water or hydrogen, and oxygen, for example, aluminum oxide or hafnium oxide. This can inhibit diffusion of impurities such as hydrogen or water from a layer under the insulator 222 into a layer over the insulator 222. Moreover, downward diffusion of oxygen contained in the insulator 224 or the like can be inhibited.

Furthermore, the concentration of impurities such as water, hydrogen, or nitrogen oxide in the insulator 224 is preferably lowered. For example, the amount of hydrogen released from the insulator 224 that is converted into hydrogen molecules per unit area of the insulator 224 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in thermal desorption spectroscopy (TDS) in the range from 50° C. to 500° C. The insulator 224 is preferably formed using an insulator from which oxygen is released by heating.

The insulator 412 can function as a first gate insulating film, and the insulator 220, the insulator 222, and the insulator 224 can function as a second gate insulating film.

Figure 16B:
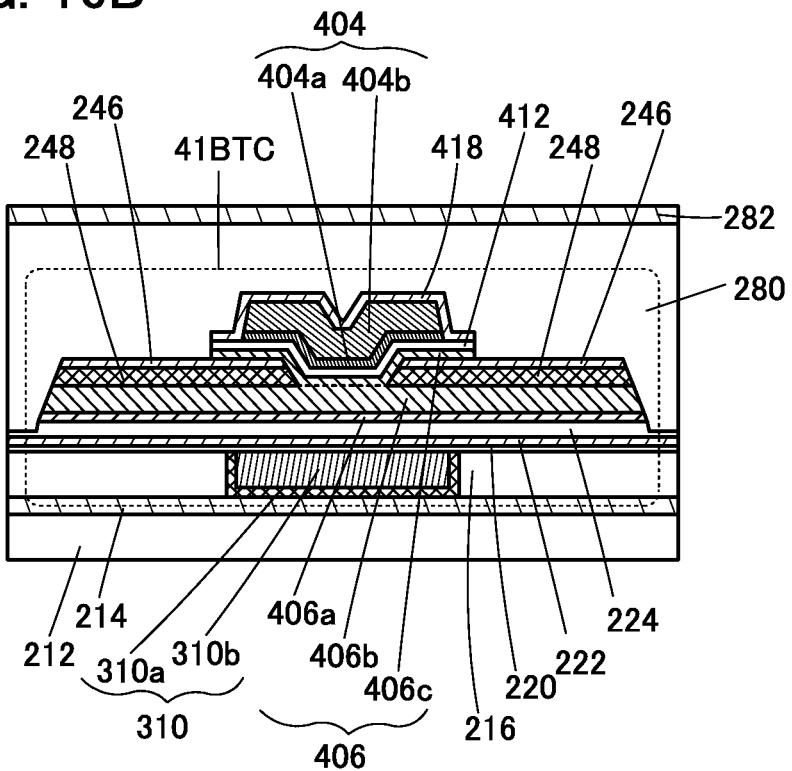

FIG. 16(B) illustrates a cross-sectional view of a transistor 41BTC, which has a structure different from that illustrated in FIG. 16(A). Like FIG. 16(A), FIG. 16(B) is also a cross-sectional view in the channel width direction of the transistor 41BTC.

A metal oxide functioning as an oxide semiconductor (hereinafter, also referred to as an oxide semiconductor) is preferably used as the oxide 406. For example, a metal oxide having an energy gap of 2 eV or more, preferably 2.5 eV or more is preferably used for the metal oxide. With the use of a metal oxide having such a wide energy gap, the off-state current of the transistor can be reduced.

A transistor using an oxide semiconductor has an extremely low leakage current in a non-conduction state;

thus, a semiconductor device with low power consumption can be provided. In addition, an oxide semiconductor can be deposited by a sputtering method or the like, and thus can be used for a transistor included in a highly integrated semiconductor device.

An oxide semiconductor preferably contains at least indium or zinc. In particular, indium and zinc are preferably contained. Moreover, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be combined as the element M.

Note that in this specification and the like, a metal oxide containing nitrogen is also collectively referred to as a metal oxide in some cases. Alternatively, a metal oxide containing nitrogen may be referred to as a metal oxynitride.

Here, the atomic ratio of the element M to the constituent elements in the metal oxide used as the oxide 406a is preferably greater than the atomic ratio of the element M to the constituent elements in the metal oxide used as the oxide 406b. Moreover, the atomic ratio of the element M to In in the metal oxide used as the oxide 406a is preferably greater than the atomic ratio of the element M to In in the metal oxide used as the oxide 406b.

When using the above metal oxide as the oxide 406a, it is preferable that the energy of the conduction band minimum of the oxide 406a be higher than the energy of the conduction band minimum of the region of the oxide 406b where the energy of the conduction band minimum is low. In other words, the electron affinity of the oxide 406a is preferably smaller than the electron affinity of the region of the oxide 406b where the energy of the conduction band minimum is low.

Here, the energy level of the conduction band minimum is gradually varied in the oxide 406a and the oxide 406b. In other words, the energy level of the conduction band minimum is continuously varied or continuously connected. To obtain such a band diagram, the density of defect states in a mixed layer formed at the interface between the oxide 406a and the oxide 406b is preferably decreased.

Specifically, when the oxide 406a and the oxide 406b contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as the oxide 406a.

At this time, a narrow-gap portion formed in the oxide 406b serves as a main carrier path. Since the density of defect states at the interface between the oxide 406a and the oxide 406b can be decreased, the influence of interface scattering on carrier conduction is small, and a high on-state current can be obtained.

The oxide 406 includes a region 426a, a region 426b, and a region 426c. As illustrated in FIG. 16(A), the region 426a is sandwiched between the region 426b and the region 426c. The region 426b and the region 426c are reduced in resistance through the film formation of the insulator 225, and have higher conductivity than the region 426a. An impurity element such as hydrogen or nitrogen, which is contained in a film formation atmosphere of the insulator 225, is added to the region 426b and the region 426c. Thus, owing to the added impurity element, oxygen vacancies are formed mainly in the regions of the oxide 406b that overlap with the insulator 225, and furthermore the impurity element enters the oxygen vacancies, which increases the carrier density and decreases the resistance.

Therefore, the region 426b and the region 426c preferably have a higher concentration of at least one of hydrogen and nitrogen than the region 426a. The concentration of hydrogen or nitrogen can be measured by secondary ion mass spectrometry (SIMS) or the like.

Note that the region 426b and the region 426c are reduced in resistance by addition of an element that forms oxygen vacancies or an element that is bonded to oxygen vacancies. Typical examples of the element include hydrogen, boron, carbon, nitrogen, fluorine, phosphorus, sulfur, chlorine, titanium, and a rare gas. In addition, typical examples of the rare gas element include helium, neon, argon, krypton, and xenon. Thus, the region 426b and the region 426c may have a structure containing one or more of the above elements.

The region 426b and the region 426c are formed in at least the regions of the oxide 406 that overlap with the insulator 225. Here, one of the region 426b and the region 426c in the oxide 406b can function as a source region, and the other can function as a drain region. Moreover, the region 426a in the oxide 406b can function as a channel formation region.

The insulator 412 is preferably positioned in contact with the top surface of the oxide 406b. The insulator 412 is preferably formed using an insulator from which oxygen is released by heating. When such an insulator 412 is provided in contact with the top surface of the oxide 406b, oxygen can be supplied to the oxide 406b effectively. Furthermore, as in the insulator 224, the concentration of impurities such as water or hydrogen in the insulator 412 is preferably lowered. The thickness of the insulator 412 is preferably greater than or equal to 1 nm and less than or equal to 20 nm, and may be approximately 10 nm, for example.

The insulator 412 preferably contains oxygen. For example, the amount of oxygen molecules released that is converted into oxygen molecules per unit area of the insulator 412, is greater than or equal to $1 \times 10^{14}$ molecules/cm$^2$, preferably greater than or equal to $2 \times 10^{14}$ molecules/cm$^2$, further preferably greater than or equal to $4 \times 10^{14}$ molecules/cm$^2$ in thermal desorption spectroscopy (TDS analysis) in the range of the surface temperatures from 100° C. to 700° C., or from 100° C. to 500° C.

The insulator 412 and the conductor 404 each include a region that overlaps with the oxide 406b. In addition, it is preferable that side surfaces of the insulator 412, the conductor 404a, and the conductor 404b be substantially aligned with each other.

It is preferable to use a conductive oxide for the conductor 404a. For example, the metal oxide that can be used as the oxide 406a to the oxide 406c can be used. In particular, an In—Ga—Zn-based oxide with a metal atomic ratio of [In]:[Ga]:[Zn]=4:2:3 to 4.1 or in the neighborhood thereof, which has high conductivity, is preferably used. When such a conductor 404a is provided, passage of oxygen into the conductor 404b can be inhibited, and an increase in electric resistance value of the conductor 404c due to oxidation can be prevented.

In addition, by depositing such a conductive oxide by a sputtering method, oxygen can be added to the insulator 412, so that oxygen can be supplied to the oxide 406b. Thus, oxygen vacancies in the region 426a of the oxide 406 can be reduced.

The conductor 404b can be formed using a metal such as tungsten, for example. In addition, as the conductor 404b, a conductor that can add impurities such as nitrogen to the conductor 404a to improve the conductivity of the conductor 404a may be used. For example, titanium nitride is preferably used for the conductor 404b. Alternatively, the conductor 404b may have a stacked-layer structure including a metal nitride such as titanium nitride and a metal such as tungsten thereover.

A metal oxide functioning as an oxide semiconductor (hereinafter, also referred to as an oxide semiconductor) is preferably used as the oxide 406.

An oxide semiconductor preferably contains at least indium or zinc. In particular, indium and zinc are preferably contained. Moreover, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an InMZnO that contains indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be combined as the element M.

Note that in this specification and the like, a metal oxide containing nitrogen is also collectively referred to as a metal oxide in some cases. Alternatively, a metal oxide containing nitrogen may be referred to as a metal oxynitride.

Modification Example 1 of Cross-Sectional Structure 1

FIG. 17 illustrates a modification example of this embodiment. FIG. 17 is different from FIG. 15 in the structure of the transistor 53.

In the transistor 53 illustrated in FIG. 17, the semiconductor region 313 (part of the substrate 311) where the channel is formed has a protruding shape. The conductor 316 is provided to cover side surfaces and a top surface of the semiconductor region 313 with the insulator 315 therebetween. Note that for the conductor 316, a material that adjusts the work function may be used. Such a transistor 53 is also referred to as a FIN-type transistor because it utilizes a protruding portion of the semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be reduced and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. Alternatively, a miniaturized or highly integrated semiconductor device can be provided with high productivity.

Modification Example 2 of Cross-Sectional Structure 1

FIG. 18 illustrates a modification example of this embodiment. FIG. 18 is different from FIG. 15 in the structure of the capacitor 51.

In a semiconductor device illustrated in FIG. 18, an insulator 287 is provided over the insulator 286, the conductor 112 is embedded in the insulator 287, an insulator 155 is provided over the insulator 287, the conductors 110 are provided in a plurality of openings formed in the insulator 155, the insulator 130 is provided over the conductors 110, and the conductor 120 is provided over the insulator 130 so as to overlap with the conductors 110. The conductor 112 may be provided to connect the conductor 248 electrically connected to the transistor 41B and the conductor 248 electrically connected to the transistor 53, and the conductors 110 may be provided in contact with the conductor 112. A material similar to that for the insulator 320 can be used for the insulator 287 and the insulator 155.

In the capacitor 51 illustrated in FIG. 18, the conductors 110, the insulator 130, and the conductor 120 overlap with one another in the openings formed in the insulator 155; thus, the conductors 110, the insulator 130, and the conductor 120 preferably have favorable coverage. For this reason, the conductors 110, the insulator 130, and the conductor 120 are preferably formed using a method for forming a film having favorable step coverage, such as a CVD method or an ALD method.

Because the capacitor 51 is formed along the shapes of the openings provided in the insulator 155, the electrostatic capacitance can be larger as the openings become deeper. Furthermore, the electrostatic capacitance can be larger as the number of the openings becomes larger. By forming such a capacitor 51, the electrostatic capacitance can be increased without increasing the area of the top surface of the capacitor 51.

The above is the description of the modification example. With the use of the structure, a change in electrical characteristics can be reduced and reliability can be improved in a semiconductor device using a transistor including an oxide semiconductor. Alternatively, the power consumption of a semiconductor device using a transistor including an oxide semiconductor can be reduced. Alternatively, a semiconductor device using a transistor including an oxide semiconductor can be miniaturized or highly integrated. Alternatively, a miniaturized or highly integrated semiconductor device can be provided with high productivity.

The structure and method described above in this embodiment can be implemented in combination as appropriate with the structures and methods described in the other embodiments.

Embodiment 4

In this embodiment, one embodiment of a semiconductor device will be described with reference to FIG. 19 to FIG. 21.

<Semiconductor Wafer and Chip>

Figure 19A:
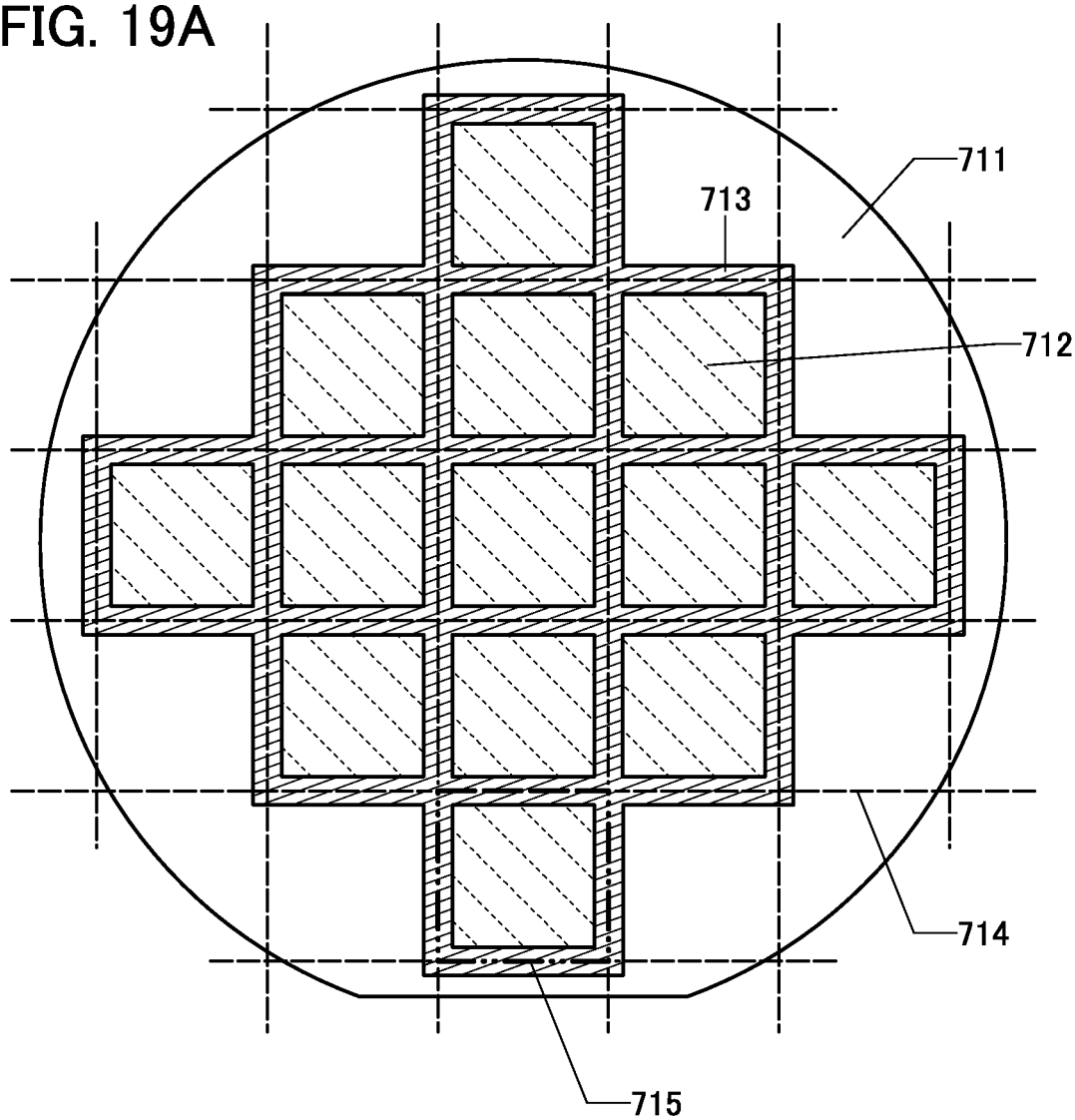
FIG. 19 Top views illustrating a semiconductor wafer.

FIG. 19(A) is a top view of a substrate 711 before dicing treatment is performed. As the substrate 711, a semiconductor substrate (also referred to as a "semiconductor wafer") can be used, for example. A plurality of circuit regions 712 are provided over the substrate 711. A semiconductor device and the like of one embodiment of the present invention can be provided in the circuit region 712.

Figure 19B:
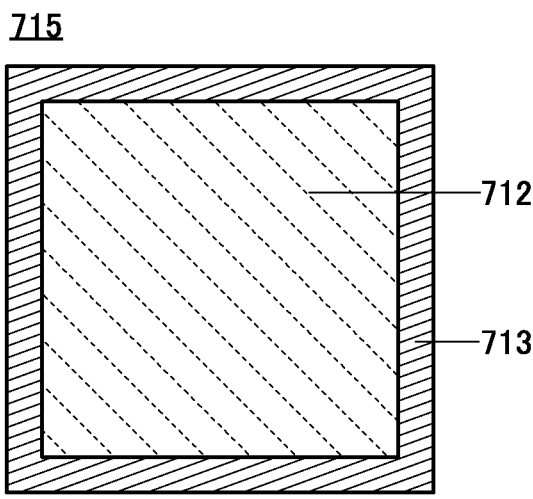

The plurality of circuit regions 712 are each surrounded by a separation region 713. Separation lines (also referred to as "dicing lines") 714 are set at a position overlapping with the separation regions 713. The substrate 711 is cut along the separation lines 714, whereby chips 715 including the circuit regions 712 can be cut out. FIG. 19(B) illustrates an enlarged view of the chip 715.

In addition, a conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield due to the dicing step. Furthermore, a dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Moreover, the productivity of semiconductor devices can be improved.

<Electronic Component>

An example of an electronic component using the chip 715 is described with reference to FIG. 20(A), FIG. 20(B), and FIGS. 21(A) to 21(E). Note that the electronic component is also referred to as a semiconductor package or an IC package. The electronic component has a plurality of standards, names, and the like depending on a terminal extraction direction, a terminal shape, and the like.

The electronic component is completed when the semiconductor device described in the above embodiment is combined with components other than the semiconductor device in an assembly process (post-process).

Figure 20A:
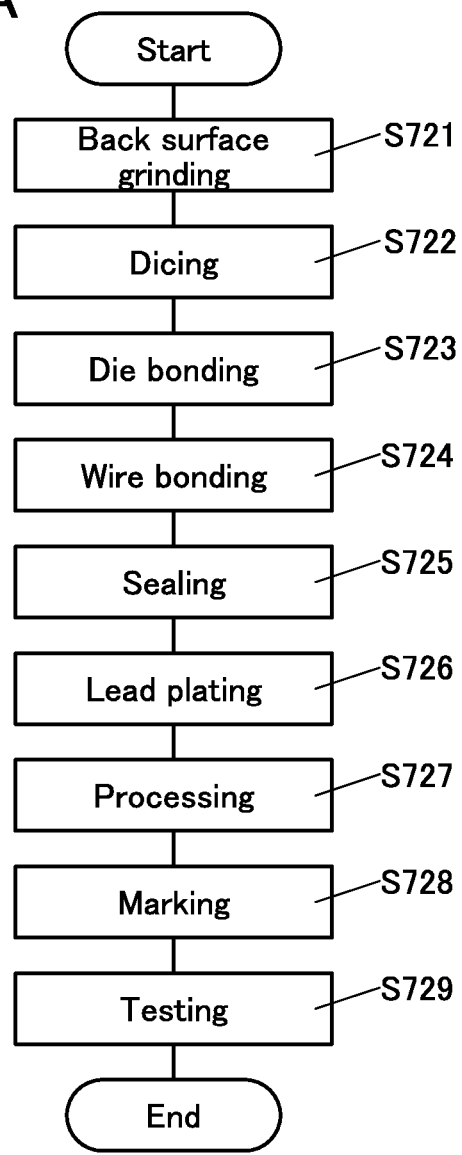
FIG. 20 A flow chart and a schematic perspective view showing an example of a manufacturing process of an electronic component.

The post-process is described with reference to a flow chart shown in FIG. 20(A). After the semiconductor device and the like of one embodiment of the present invention are formed over the substrate 711 in a pre-process, a "back surface grinding step" for grinding a back surface (a surface where the semiconductor device and the like are not formed) of the substrate 711 is performed (Step S721). When the substrate 711 is thinned by grinding, the size of the electronic component can be reduced.

Next, a "dicing step" for dividing the substrate 711 into a plurality of chips 715 is performed (Step S722). Then, a "die bonding step" for individually bonding the divided chips 715 to a lead frame is performed (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a "wire bonding step" for electrically connecting a lead of the lead frame and an electrode on the chip 715 through a metal wire is performed (Step S724). As the metal wire, a silver wire, a gold wire, or the like can be used. In addition, ball bonding or wedge bonding can be used as the wire bonding, for example.

The wire-bonded chip 715 is subjected to a "sealing step (molding step)" for sealing the chip with an epoxy resin or the like (Step S725). Through the sealing step, the inside of the electronic component is filled with a resin, so that a wire for connecting the chip 715 to the lead can be protected from external mechanical force, and deterioration of characteristics (decrease in reliability) due to moisture, dust, or the like can be reduced.

Subsequently, a "lead plating step" for plating the lead of the lead frame is performed (Step S726). By the plating treatment, corrosion of the lead can be prevented, and soldering at the time of mounting the electronic component on a printed circuit board in a later step can be performed more surely. Then, a "formation step" for cutting and processing the lead is performed (Step S727).

Next, a "marking step" for printing (marking) a surface of the package is performed (Step S728). Then, after a "testing step" (Step S729) for checking whether an external shape is good and whether there is malfunction, for example, the electronic component is completed.

Figure 20B:
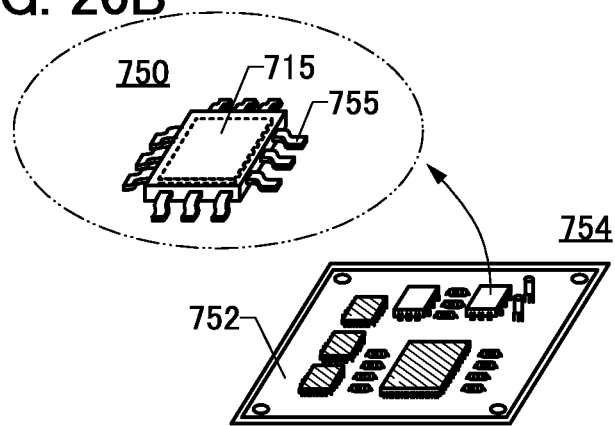

Furthermore, FIG. 20(B) shows a schematic perspective view of the completed electronic component. FIG. 20(B) shows a schematic perspective view of a QFP (Quad Flat Package) as an example of the electronic component. An electronic component 750 illustrated in FIG. 20(B) includes a lead 755 and the chip 715. The electronic component 750 may include a plurality of chips 715.

The electronic component 750 illustrated in FIG. 20(B) is mounted on a printed circuit board 752, for example. A plurality of such electronic components 750 are combined and electrically connected to each other on the printed circuit board 752; thus, a board on which the electronic components are mounted (a circuit board 754) is completed. The completed circuit board 754 is used for an electronic device or the like.

Application examples of the electronic component 750 illustrated in FIG. 20(B) are described. The electronic component 750 can be applied to a variety of removable storage devices such as memory cards (e.g., SD cards), USB memories (USB: Universal Serial Bus), and SSDs (Solid State Drives). Some structure examples of the removable storage devices are described with reference to FIGS. 21(A) to 21(E).

Figure 21A:
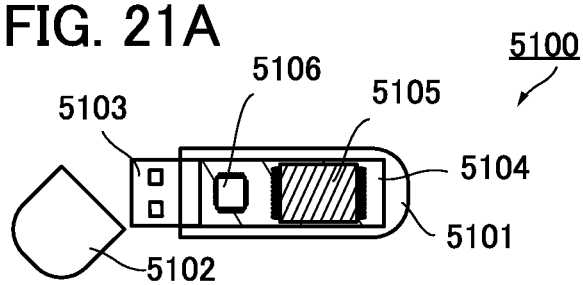
FIG. 21 Drawings each illustrating an electronic component.

FIG. 21(A) is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory chip, which is an electronic component, and the like. For example, the substrate 5104 is provided with a memory chip 5105 and a controller chip 5106. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5105. A processor, a work memory, an ECC circuit, and the like are incorporated in the controller chip 5106. Note that the circuit configurations of the memory chip 5105 and the controller chip 5106 are not limited to those described above, and the circuit configurations can be changed as appropriate depending on the circumstances or case. For example, a configuration may be employed in which the row decoder 2621, the word line driver circuit 2622, the bit line driver circuit 2630, the column decoder 2631, the precharge circuit 2632, and the sense amplifier 2633 are incorporated in the controller chip 5106, not in the memory chip 5105. The USB connector 5103 functions as an interface for connection to an external device.

Figure 21B:
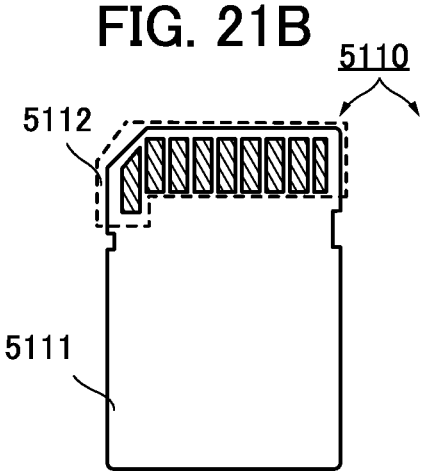
Figure 21C:
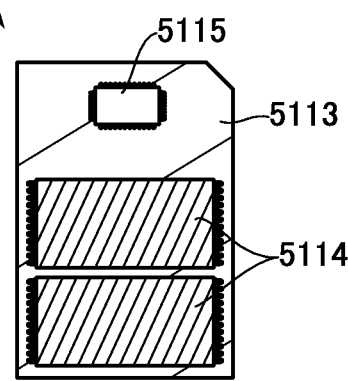

FIG. 21(B) is an external schematic diagram of an SD card, and FIG. 21(C) is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory chip, which is an electronic component, and the like. For example, the substrate 5113 is provided with a memory chip 5114 and a controller chip 5115. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and the circuit configurations can be changed as appropriate depending on the circumstances or case. For example, a configuration may be employed in which the row decoder 2621, the word line driver circuit 2622, the bit line driver circuit 2630, the column decoder 2631, the precharge circuit 2632, and the sense amplifier 2633 are incorporated in the controller chip 5115, not in the memory chip 5114.

When the memory chip 5114 is also provided on a back side of the substrate 5113, the capacity of the SD card 5110 can be increased. In addition, a wireless chip with a radio communication function may be provided on the substrate 5113. Accordingly, wireless communication between an external device and the SD card 5110 can be performed, which allows reading/writing of data from/to the memory chip 5114.

Figure 21D:
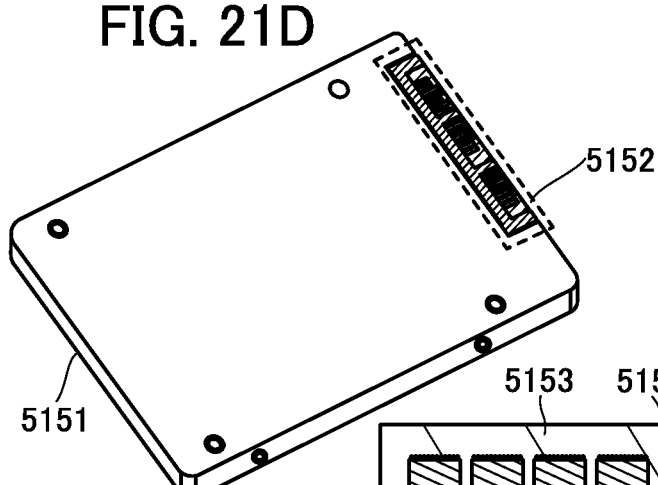
Figure 21E:
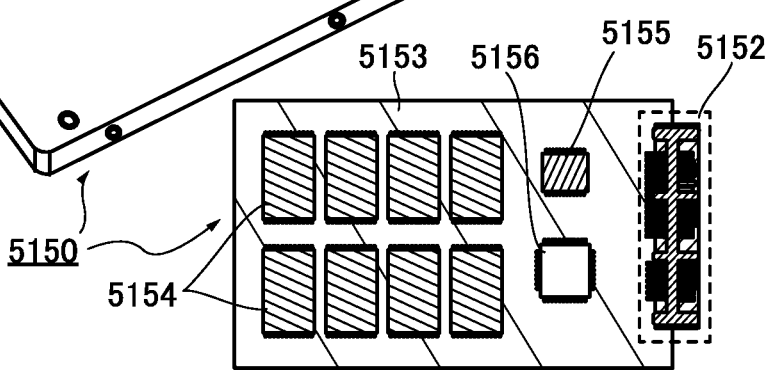

FIG. 21(D) is an external schematic diagram of an SSD, and FIG. 21(E) is a schematic diagram illustrating the internal structure of the SDD. An SSD 5150 includes a housing 5151, a connector 5152, and a substrate 5153. The connector 5152 functions as an interface for connection to an external device. The substrate 5153 is held in the housing 5151. The substrate 5153 is provided with a memory chip, which is an electronic component, and the like. For example, the substrate 5153 is provided with a memory chip 5154, a memory chip 5155, and a controller chip 5156. The memory cell array 2610, the row decoder 2621, the word line driver circuit 2622, the bit line driver circuit 2630, the column decoder 2631, the precharge circuit 2632, the sense amplifier 2633, the output circuit 2640, and the like which are described in the above embodiment are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and the circuit configurations can be changed as appropriate depending on the circumstances or case. For example, a memory functioning as a work memory may also be provided in the controller chip 5156.

Note that this embodiment can be combined with the other embodiments in this specification as appropriate.

Embodiment 5

<Electronic Device>

An electronic component including the semiconductor device of one embodiment of the present invention can be used for a variety of electronic devices. FIG. 22 illustrates specific examples of electronic devices including the electronic component of one embodiment of the present invention.

Figure 22A:
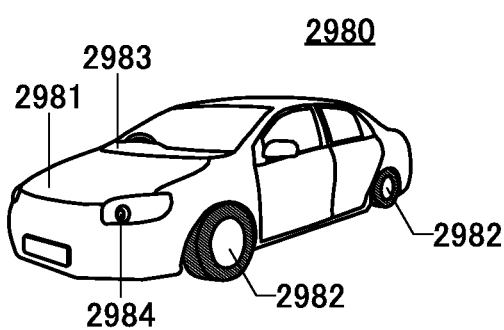
FIG. 22 Drawings each illustrating an electronic device.

FIG. 22(A) is an external view illustrating an example of a car. A car 2980 includes a car body 2981, wheels 2982, a dashboard 2983, lights 2984, and the like. The car 2980 also includes an antenna, a battery, and the like.

Figure 22B:
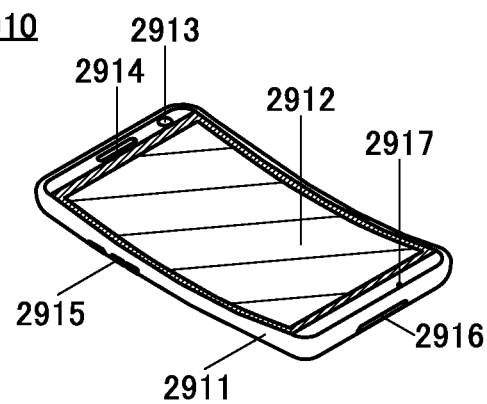

An information terminal 2910 illustrated in FIG. 22(B) includes a housing 2911, a display portion 2912, a microphone 2917, a speaker portion 2914, a camera 2913, an external connection portion 2916, operation switches 2915, and the like. A display panel and a touch screen that uses a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 22C:
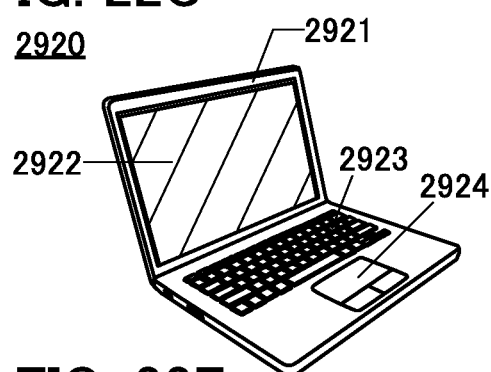

A notebook personal computer 2920 illustrated in FIG. 22(C) includes a housing 2921, a display portion 2922, a keyboard 2923, a pointing device 2924, and the like. In addition, the notebook personal computer 2920 includes an antenna, a battery, and the like inside the housing 2921.

Figure 22D:
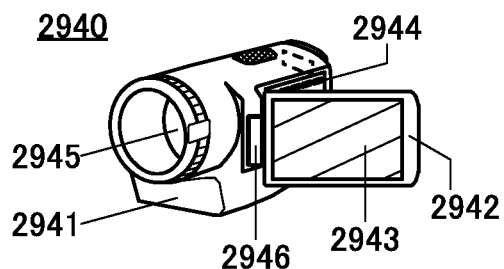

A video camera 2940 illustrated in FIG. 22(D) includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. Depending on the angle between the housing 2941 and the housing 2942, the orientation of an image displayed on the display portion 2943 can be changed or display and non-display of an image can be switched.

Figure 22E:
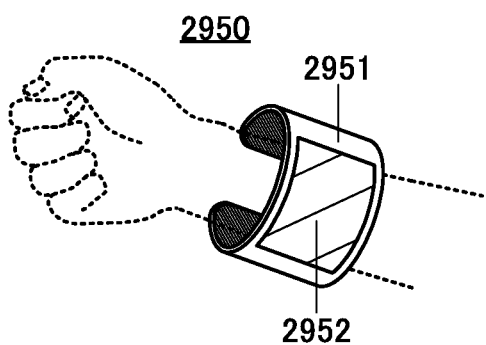

FIG. 22(E) illustrates an example of a bangle-type information terminal. An information terminal 2950 includes a housing 2951, a display portion 2952, and the like. The information terminal 2950 includes an antenna, a battery, and the like inside the housing 2951. The display portion 2952 is supported by the housing 2951 having a curved surface. A display panel using a flexible substrate is provided in the display portion 2952, whereby the information terminal 2950 that is flexible, lightweight, and user-friendly can be provided.

Figure 22F:
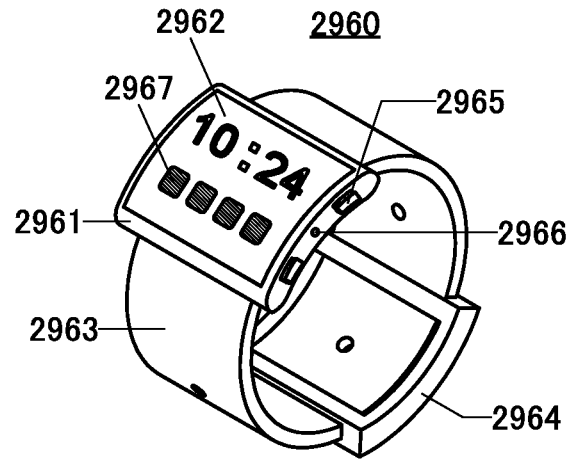

FIG. 22(F) illustrates an example of a watch-type information terminal. An information terminal 2960 includes a housing 2961, a display portion 2962, a band 2963, a buckle 2964, operation switches 2965, an input/output terminal 2966, and the like. The information terminal 2960 also includes an antenna, a battery, and the like inside the housing 2961. The information terminal 2960 is capable of executing a variety of applications such as mobile phone calls, e-mailing, viewing and editing texts, music reproduction, Internet communication, and computer games.

The display surface of the display portion 2962 is curved, and display can be performed along the curved display surface. In addition, the display portion 2962 includes a touch sensor, and operation can be performed by touching the screen with a finger, a stylus, or the like. For example, by touching an icon 2967 displayed on the display portion 2962, an application can be started. The operation switches 2965 can have a variety of functions such as time setting, power on/off operation, turning on/off operation of wireless communication, setting and cancellation of a silent mode, and setting and cancellation of a power saving mode. For example, the functions of the operation switches 2965 can be set by the operation system incorporated in the information terminal 2960.

Furthermore, the information terminal 2960 can execute near field communication conformable to a communication standard. For example, mutual communication with a headset capable of wireless communication enables hands-free calling. Moreover, the information terminal 2960 includes the input/output terminal 2966, and thus can perform direct data transmission with another information terminal through a connector. In addition, charging can be performed via the input/output terminal 2966. Note that the charging operation may be performed by wireless power feeding without through the input/output terminal 2966.

For example, the electronic component including the semiconductor device of one embodiment of the present invention can hold control data, a control program, or the like of the above electronic device for a long time. With the use of the semiconductor device of one embodiment of the present invention, a highly reliable electronic device can be achieved.

This embodiment can be implemented in an appropriate combination with any of the structures described in the other embodiments.

Supplementary Notes on the Description in this Specification and the Like

The description of the above embodiments and the structures in the embodiments are noted below.

One embodiment of the present invention can be constituted by combining, as appropriate, the structure described in an embodiment with any of the structures described in the other embodiments. In addition, in the case where a plurality of structure examples are described in one embodiment, some of the structure examples can be combined with each other as appropriate.

Note that a content (or part of the content) described in an embodiment can be applied to, combined with, or replaced with another content (or part of the content) described in the embodiment and/or a content (or part of the content) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, blocks in the block diagrams are not limited by any of the components described in the specification, and the description can be changed appropriately depending on the circumstance.

In the drawings, the size, the layer thickness, or the region is shown with arbitrary magnitude for description convenience. Therefore, they are not necessarily limited to the illustrated scale. Note that the drawings are schematically shown for clarity, and embodiments of the present invention are not limited to shapes, values or the like shown in the drawings. For example, the following can be included: variation in signal, voltage, or current due to noise or variation in signal, voltage, or current due to difference in timing.

In this specification and the like, one of a source and a drain is denoted as "one of a source and a drain" (or a first electrode or a first terminal) and the other of the source and the drain is denoted as "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like appropriately depending on the circumstance.

Furthermore, in this specification and the like, the term "electrode" or "wiring" does not functionally limit the component. For example, an "electrode" is used as part of a "wiring" in some cases, and vice versa. Moreover, the term "electrode" or "wiring" also includes the case where a plurality of "electrodes" or "wirings" are formed in an integrated manner, for example.

Furthermore, in this specification and the like, voltage and potential can be interchanged with each other as appropriate. The voltage refers to a potential difference from a reference potential. When the reference potential is a ground voltage, for example, the voltage can be rephrased into the potential. The ground potential does not necessarily mean 0 V. Potentials are relative values, and the potential applied to a wiring or the like is changed depending on the reference potential, in some cases.

Note that in this specification and the like, the terms "film" and "layer" can be interchanged with each other depending on the case or circumstances. For example, the term "conductive layer" can be changed into the term "conductive film" in some cases. Furthermore, for example, the term "insulating film" can be changed into the term "insulating layer" in some cases.

In this specification and the like, a switch conducting (on state) or not conducting (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, an "on state" of the transistor refers to a state in which a source and a drain of the transistor can be regarded as being electrically short-circuited. Furthermore, an "off state" of the transistor refers to a state in which the source and the drain of the transistor can be regarded as being electrically cut off. Note that in the case where a transistor operates just as a switch, the polarity (conductivity type) of the transistor is not particularly limited to a certain type.

An example of a mechanical switch is a switch using a MEMS (micro electro mechanical systems) technology, such as a digital micromirror device (DMD). Such a switch includes an electrode that can be moved mechanically, and operates by controlling conduction and non-conduction in accordance with movement of the electrode.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, when A and B are connected, it means the case where A and B are electrically connected to each other as well as the case where A and B are directly connected to each other. Here, when A and B are electrically connected, it means the case where electric signals can be transmitted and received between A and B when an object having any electric action exists between A and B.

Reference Numerals

FN1 node, FN2 node, FN3 node, NB1 wiring, NB2 wiring, NP1 neuron, NP2 neuron, NP3 neuron, NQ1 neuron, NQ3 neuron, R1 resistor, R2 current-voltage conversion element, S1 switch, 10 semiconductor device, 11 input layer, 12 intermediate layer, 13 output layer, 14 output circuit, 20 input register circuit, 21 input selector circuit, 22 digital-analog conversion circuit, 23 neuron, 23a synapse circuit, 23b memory unit, 24a activation function circuit, 25a column decoder, 26 row decoder, 27 analog-digital conversion circuit, 28 output register, 30 current source circuit, 31 column output circuit, 31a current-voltage conversion circuit, 31b offset circuit, 31c offset circuit, 31d comparison circuit, 32 offset current circuit, 32a current sink circuit. 32b current supply circuit, 32c current sink circuit, 32d current supply circuit, 41 transistor, 41B transistor, 41BTC transistor, 42 transistor, 42p transistor, 43 transistor, 44 transistor, 45 transistor, 46 transistor, 47 transistor, 48 transistor, 49 transistor, 51 capacitor, 52 capacitor, 53 transistor, 59 transistor, 61 transistor, 62 transistor, 63 transistor, 64 capacitor, 65 transistor, 66 transistor, 67 transistor, 68 capacitor. 110 conductor, 112 conductor, 120 conductor, 130 insulator, 150 insulator, 155 insulator, 205 conductor, 210 insulator, 212 insulator, 214 insulator, 216 insulator, 218 conductor, 220 insulator, 222 insulator, 224 insulator, 225 insulator, 230 oxide, 246 conductor, 248 conductor, 280 insulator, 281 insulator, 282 insulator, 286 insulator, 287 insulator, 310 conductor, 310a conductor, 310b conductor, 311 substrate. 313 semiconductor region, 314a low-resistance region, 314b low-resistance region, 315 insulator, 316 conductor, 320 insulator, 322 insulator, 324 insulator, 326 insulator, 328 conductor, 330 conductor, 350 insulator, 352 insulator, 354 insulator, 356 conductor, 360 insulator, 362 insulator, 364 insulator, 366 conductor, 370 insulator, 372 insulator, 374 insulator, 376 conductor, 380 insulator, 382 insulator, 384 insulator, 386 conductor, 401 insulator, 404 conductor, 404a conductor, 404b conductor, 404c conductor, 406 oxide, 406a oxide, 406b oxide, 406c oxide, 412 insulator, 418 sidewall insulator, 426a region. 426b region, 426c region, 711 substrate, 712 circuit region, 713 separation region, 714 separation line, 715 chip, 750 electronic component, 752 printed circuit board, 754 completed circuit board, 755 lead, 2610 memory cell array, 2621 row decoder, 2622 word line driver circuit, 2630 bit line driver circuit, 2631 column decoder, 2632 precharge circuit, 2633 sense amplifier, 2640 output circuit, 2910 information terminal, 2911 housing, 2912 display portion, 2913 camera, 2914 speaker portion, 2915 operation switch, 2916 external connection portion, 2917 microphone, 2920 notebook personal computer, 2921 housing. 2922 display portion 2923 keyboard, 2924 pointing device, 2940 video camera, 2941 housing, 2942 housing, 2943 display portion, 2944 operation switch, 2945 lens, 2946 joint, 2950 information terminal, 2951 housing, 2952 display portion, 2960 information terminal, 2961 housing, 2962 display portion, 2963 band, 2964 buckle, 2965 operation switch, 2966 input/output terminal, 2967 icon, 2980 car, 2981 car body, 2982 wheel, 2983 dashboard, 2984 light, 5100 USB memory, 5101 housing, 5102 cap, 5103 USB connector, 5104 substrate, 5105 memory chip, 5106 controller chip, 5110 SD card, 5111 housing, 5112 connector, 5113 substrate, 5114 memory chip, 5115 controller chip, 5150 SSD, 5151 housing, 5152 connector, 5153 substrate, 5154 memory chip, 5155 memory chip, 5156 controller chip

The invention claimed is:

1. A semiconductor device comprising a neural network, wherein the neural network comprises a multilayer perceptron, a row decoder, and a column decoder,
  wherein the perceptron comprises a plurality of neurons,
  wherein a neuron of the plurality of neurons comprises a synapse circuit and an activation function circuit,
  wherein the synapse circuit comprises a plurality of memory cells, a signal line WD, a signal line WW, a signal line SL, a signal line RW, and a wiring COM,
  wherein the column decoder is configured such that address information for selecting a memory cell of the plurality of memory cells is different in every perceptron,
  wherein the row decoder is configured such that a bit line selected by the address information for selecting the memory cell is shared by a plurality of perceptrons,
  wherein the memory cell is supplied with a weight coefficient of a first analog signal,
  wherein the synapse circuit is supplied with an input signal of a second analog signal,
  wherein the memory cell is configured to multiply the input signal by the weight coefficient,
  wherein the memory cell is configured to convert the multiplied product into a first current,
  wherein the synapse circuit is configured to generate a second current by adding a plurality of first currents,
  wherein the synapse circuit is configured to convert the second current into a first potential,
  wherein the activation function circuit is configured to convert the first potential into a second potential by a ramp function,
  wherein another synapse circuit comprised in another neuron of the plurality of neurons in a next stage is supplied with the second potential as an input signal,
  wherein the memory cell comprises a first transistor, a second transistor, and a first capacitor, wherein the memory cell is electrically connected to the signal line WD, the signal line WW, the signal line SL, the signal line RW, and the wiring COM, wherein a gate of the first transistor is electrically connected to the signal line WW, wherein one of a source and a drain of the first transistor is electrically connected to the signal line WD, wherein the other of the source and the drain of the first transistor is electrically connected to a gate of the second transistor and one electrode of the first capacitor, wherein one of a source and a drain of the second transistor is electrically connected to the signal line SL, wherein the other of the source and the drain of the second transistor is electrically connected to the wiring COM, wherein the other electrode of the first capacitor is electrically connected to the signal line RW.

2. The semiconductor device according to claim 1, wherein a first node is formed by connecting the gate of the second transistor, the other of the source and the drain of the first transistor, and the one electrode of the first capacitor with one another, wherein the first node is configured to retain the weight coefficient as a weight potential, wherein the signal line RW is configured to supply the input signal to the other electrode of the first capacitor, wherein the first node is configured to be changed into a third potential by adding the input signal to the weight potential through the first capacitor, wherein the gate of the second transistor is supplied with the third potential, wherein the second transistor is configured to supply the first current corresponding to the third potential to flow, and wherein the second transistor is configured to multiply the input signal by the weight coefficient and convert into the first current.

3. The semiconductor device according to claim 2, wherein the synapse circuit further comprises a column output circuit, wherein the column output circuit comprises an analog adder circuit, a first output terminal, and a wiring OREF, wherein the analog adder circuit comprises a current-voltage conversion circuit, an offset circuit, and a first source follower circuit, wherein the current-voltage conversion circuit comprises a first terminal and a second terminal, wherein the offset circuit comprises a second capacitor and a third transistor, wherein the first source follower circuit comprises a fourth transistor and a fifth transistor, wherein the analog adder circuit is electrically connected to the plurality of memory cells through the signal line SL, wherein the first terminal is electrically connected to the signal line SL and one electrode of the second capacitor, wherein the second terminal is electrically connected to the wiring OREF, wherein the other electrode of the second capacitor is electrically connected to one of a source and a drain of the third transistor and a gate of the fourth transistor, wherein one of a source and a drain of the fourth transistor is electrically connected to one of a source and a drain of the fifth transistor and the first output terminal, wherein a second node is formed by connecting the other electrode of the second capacitor, the one of the source and the drain of the third transistor, and the gate of the fourth transistor with one another, wherein the second current is generated by adding the first current flowing through a plurality of second transistors connected to the signal line SL, wherein the current-voltage conversion circuit generates the first potential by being supplied with the second current, wherein the one electrode of the second capacitor is supplied with the first potential, wherein the third transistor is configured to initialize the potential of the second node, wherein the second node is configured to retain the first potential supplied to the one electrode of the second capacitor after being initialized by the third transistor, wherein the first source follower circuit is configured to convert the first potential into a fourth potential, and wherein the first output terminal outputs the fourth potential.

4. The semiconductor device according to claim 3, wherein the synapse circuit further comprises an offset current circuit, wherein the offset current circuit comprises a current sink circuit, a current supply circuit, a signal line ORM, a signal line OSM, a signal line ORP, a signal line OSP, and a wiring VDD, wherein the current sink circuit comprises a sixth transistor, a seventh transistor, an eighth transistor, and a third capacitor, wherein the current supply circuit comprises a ninth transistor, a tenth transistor, an eleventh transistor, and a fourth capacitor, wherein the current sink circuit, the current supply circuit, and the current-voltage conversion circuit are electrically connected to a plurality of the memory cells through the signal line SL, wherein the signal line SL is electrically connected to one of a source and a drain of the sixth transistor and one of a source and a drain of the ninth transistor, wherein the one of the source and the drain of the sixth transistor is further electrically connected to one of a source and a drain of the seventh transistor, wherein a gate of the sixth transistor is electrically connected to one electrode of the third capacitor, the other of the source and the drain of the seventh transistor, and one of a source and a drain of the eighth transistor, wherein the other of the source and the drain of the eighth transistor is electrically connected to the wiring COM, the other of the source and the drain of the sixth transistor, and the other electrode of the third capacitor, wherein a gate of the seventh transistor is electrically connected to the wiring OSP, wherein a gate of the eighth transistor is electrically connected to the wiring ORP, wherein the one of the source and the drain of the ninth transistor is further electrically connected to one of a source and a drain of the tenth transistor, wherein a gate of the ninth transistor is electrically connected to one electrode of the fourth capacitor, the other of the source and the drain of the tenth transistor, and one of a source and a drain of the eleventh transistor, wherein the other of the source and the drain of the eleventh transistor is electrically connected to the wiring VDD, the other of the source and the drain of the ninth transistor, and the other electrode of the fourth capacitor, wherein a gate of the tenth transistor is electrically connected to the signal line OSM, and wherein a gate of the eleventh transistor is electrically connected to the signal line ORM.

5. The semiconductor device according to claim 4, wherein the synapse circuit further comprises a current mirror circuit, wherein the current mirror circuit is configured to supply a constant current to flow through the signal line SL, wherein the signal line RW is supplied with an initial potential, wherein the first node is supplied with the weight potential, wherein the second transistor is configured to output an offset current by the weight potential supplied to the first node, wherein the current supply circuit is configured to supply current for canceling the offset current, and wherein the current sink circuit is configured to sink current for canceling the offset current.

6. The semiconductor device according to claim 3, wherein the current-voltage conversion circuit comprises one or a plurality of resistors.

7. The semiconductor device according to claim 2, wherein the first transistor, the third transistor, the fourth transistor, the fifth transistor, the seventh transistor, the eighth transistor, the tenth transistor, the eleventh transistor, the twelfth transistor, the thirteenth transistor, the fourteenth transistor, or the fifteenth transistor comprises a metal oxide in a semiconductor layer.

8. The semiconductor device according to claim 7, wherein the first transistor, the third transistor, the fourth transistor, the fifth transistor, the seventh transistor, the eighth transistor, the tenth transistor, the eleventh transistor, the twelfth transistor, the thirteenth transistor, the fourteenth transistor, or the fifteenth transistor comprises a back gate.

9. The semiconductor device according to claim 1, wherein the activation function circuit comprises a second source follower circuit, a second output terminal, a wiring OBS, a wiring NB1, and a wiring VDD, wherein the second source follower circuit comprises a twelfth transistor, a thirteenth transistor, and a fourteenth transistor, wherein a gate of the twelfth transistor is electrically connected to the wiring NB1, wherein a gate of the thirteenth transistor is electrically connected to a first output terminal, wherein a gate of the fourteenth transistor is electrically connected to the wiring OBS, wherein the second output terminal is electrically connected to one of a source and a drain of the twelfth transistor, one of a source and a drain of the thirteenth transistor, and one of a source and a drain of the fourteenth transistor, wherein the other of the source and the drain of the twelfth transistor is electrically connected to the wiring COM, wherein the other of the source and the drain of the fourteenth transistor and the other of the source and the drain of the thirteenth transistor are electrically connected to the wiring VDD, wherein the second source follower circuit functions as the ramp function, wherein the ramp function comprises a first output range and a second output range, wherein the twelfth transistor is configured to ensure a constant current, wherein the gate of the fourteenth transistor is supplied with a fifth potential through the wiring OBS, wherein the gate of the thirteenth transistor is supplied with the fourth potential through the first output terminal, wherein in the first output range, the second potential which is lower than the fifth potential by a first threshold voltage of the fourteenth transistor is output to the second output terminal, wherein in the second output range, the second potential which is lower than the fourth potential by a second threshold voltage of the thirteenth transistor is output to the second output terminal, and wherein the activation function circuit outputs the second potential at which the neuron in a next stage can perform arithmetic operation.

10. The semiconductor device according to claim 1, wherein the activation function circuit comprises an analog adder circuit, a wiring OREF, a wiring NB2, and a third output terminal, wherein the analog adder circuit comprises a current-voltage conversion circuit, a fifth capacitor, an offset circuit, and a comparison circuit, wherein the offset circuit comprises a fifteenth transistor, wherein the comparison circuit comprises a third terminal and a fourth terminal, wherein one electrode of the fifth capacitor is electrically connected to the signal line SL, wherein the other electrode of the fifth capacitor is electrically connected to the third terminal, wherein the fourth terminal is electrically connected to the wiring NB2, wherein an output of the comparison circuit is electrically connected to the third output terminal, wherein a third node is formed by connecting the other electrode of the fifth capacitor, one of a source and a drain of the fifteenth transistor, and the third terminal with one another, wherein the wiring NB2 is supplied with a determination threshold potential, wherein the second current is generated by adding the first current flowing through the plurality of second transistors connected to the signal line SL, wherein the current-voltage conversion circuit generates the first potential by being supplied with the second current, wherein the one electrode of the fifth capacitor is supplied with the first potential, wherein the fifteenth transistor is configured to initialize a potential of the third node, wherein the third node is configured to retain the first potential supplied to the one electrode of the fifth capacitor after being initialized by the fifteenth transistor, wherein the comparison circuit is configured to determine that firing occurs when the first potential is larger than the determination threshold potential, wherein the comparison circuit is configured to determine that firing does not occur when the first potential is smaller than the determination threshold potential, wherein the third output terminal is configured to output a digital signal "H" when it is determined that firing occurs, wherein the third output terminal is configured to output a digital signal "L" when it is determined that firing does not occur, and wherein the determination result of firing is output as the second potential at which the neuron in a next stage can perform arithmetic operation.

11. An electronic component comprising:

the semiconductor device according to claim 1; and a lead electrically connected to the semiconductor device.

12. An electronic device comprising:

the electronic component according to claim 11;

a printed circuit board provided with the electronic component; and a housing in which the printed circuit board is stored.

* * * * *